US012704472B1

(12) United States Patent
Siaw

(10) Patent No.: US 12,704,472 B1
(45) Date of Patent: Aug. 11, 2026

(54) MODIFICATION OF AIR/FLUID FLOW AROUND NUCLEAR MAGNETIC RESONANCE PROBE AND METHODS OF USE

(71) Applicant: JEOL LTD., Tokyo (JP)

(72) Inventor: Anthony Ting Ann Siaw, Rowley, MA (US)

(73) Assignee: JEOL LTD, Tokyo (JP)

( * ) Notice: Subject to any disclaimer, the term of this patent is extended or adjusted under 35 U.S.C. 154(b) by 171 days.

(21) Appl. No.: 18/675,057

(22) Filed: May 27, 2024

(51) Int. Cl.
*G01N 24/08* (2006.01)
*G01R 33/31* (2006.01)
*G01R 33/46* (2006.01)

(52) U.S. Cl.
CPC ........... *G01N 24/087* (2013.01); *G01R 33/31* (2013.01); *G01R 33/46* (2013.01)

(58) Field of Classification Search
CPC ....... G01N 24/087; G01R 33/31; G01R 33/46
See application file for complete search history.

(56) References Cited

U.S. PATENT DOCUMENTS

| | | | |
|---|---|---|---|
| 6,466,019 B2 | 10/2002 | Marek | |
| 9,726,735 B2 | 8/2017 | Schmidig et al. | |
| 2005/0052184 A1* | 3/2005 | Haner | G01R 33/307 324/321 |

OTHER PUBLICATIONS

Magnetism in High-Resolution NMR Probe Design. I: General Methods, by F. David Doty et al., Concepts in Magnetic Resonance, 10 (1998) 133-156.

* cited by examiner

*Primary Examiner* — G.M. A Hyder
(74) *Attorney, Agent, or Firm* — SCI-LAW STRATEGIES, PC

(57) ABSTRACT

In an embodiment of the present invention, by accelerating the variable temperature air, the cooling/heating caused by thermal radiation of the sample in the NMR field can be more efficiently removed thereby efficiently eliminating or minimizing natural convection in the sample. In an embodiment of the present invention, by passing the air/fluid flow through a restricted section prior to the air/fluid flow contacting the sample, the cooling/heating caused by thermal radiation of the sample in the NMR field can be more efficiently removed thereby efficiently eliminating or minimizing natural convection in the sample. In various embodiments of the invention, by passing the air/fluid flow through a restricted section prior to the air/fluid flow contacting the sample, the resulting NMR spectra show an increased performance, and/or line shape and/or resolution.

20 Claims, 23 Drawing Sheets

FIG. 2A
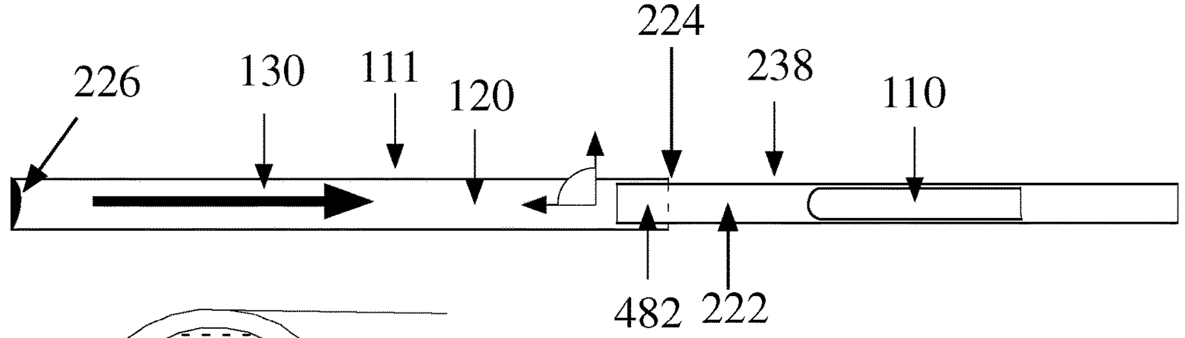
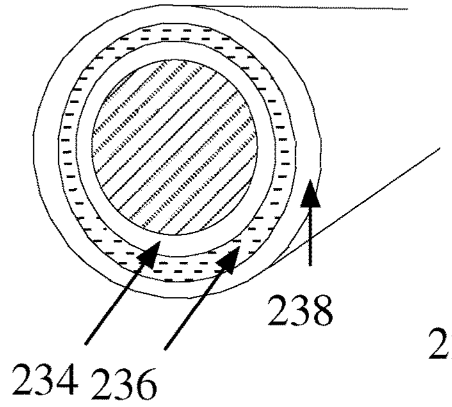
FIG. 2B
FIG. 2C
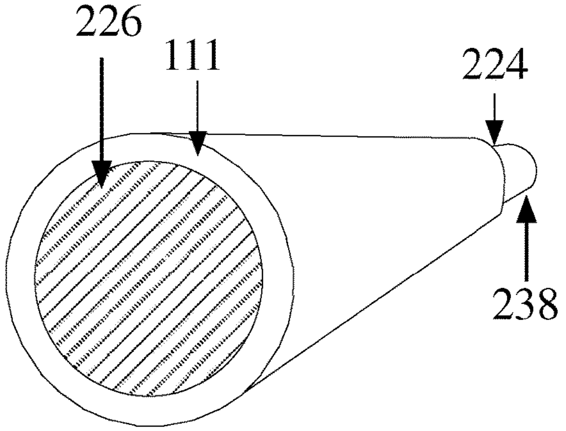
FIG. 2D
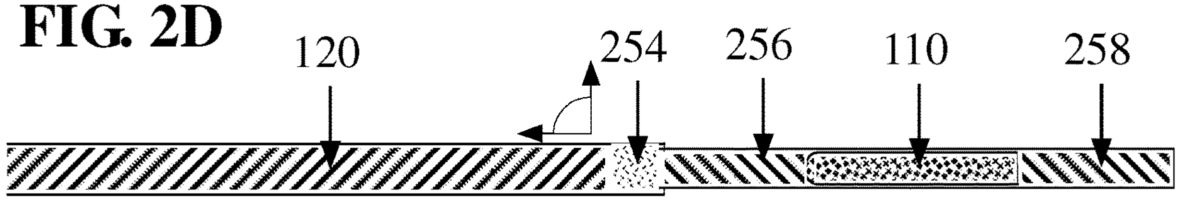
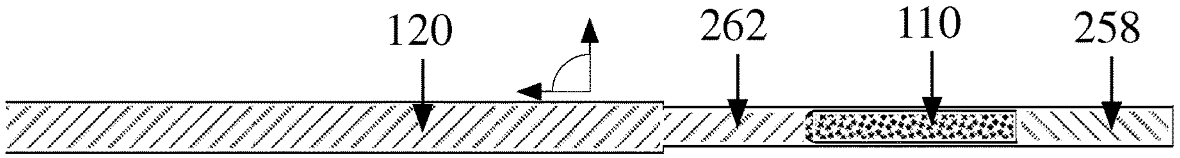
FIG. 2E
226
130
111
120
224
238
110
482
222
234
236
238
226
111
224
238
120
254
256
110
258
120
262
110
258

FIG. 4A
PRIOR ART
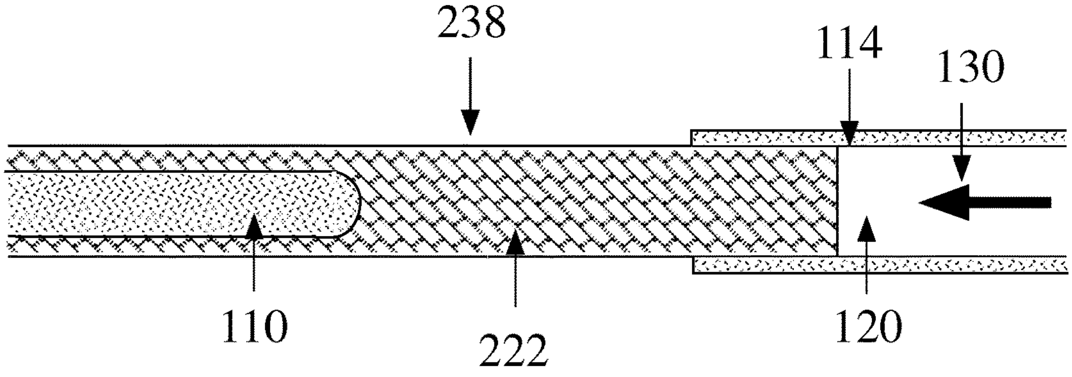
FIG. 4B
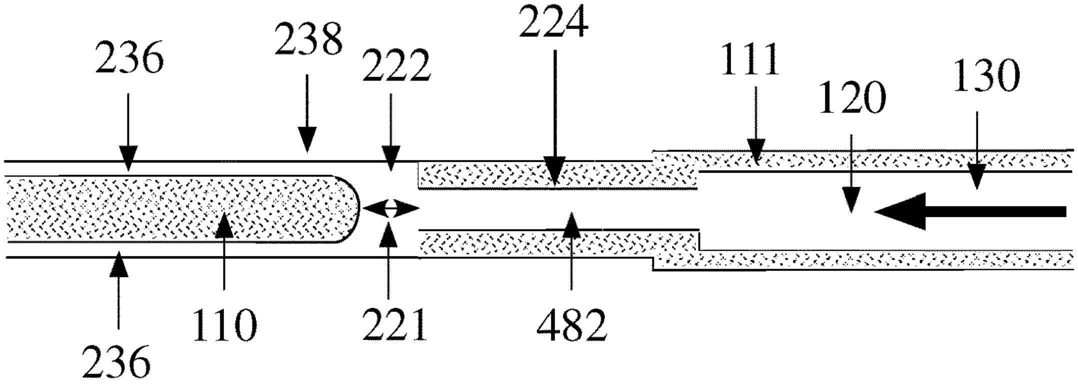
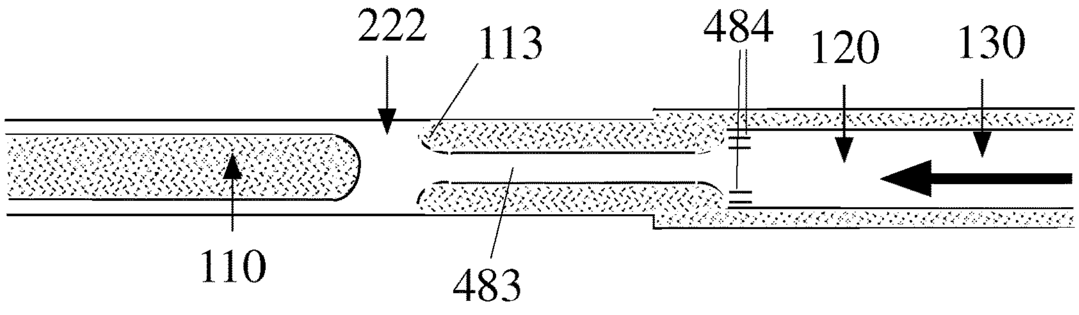
FIG. 4C
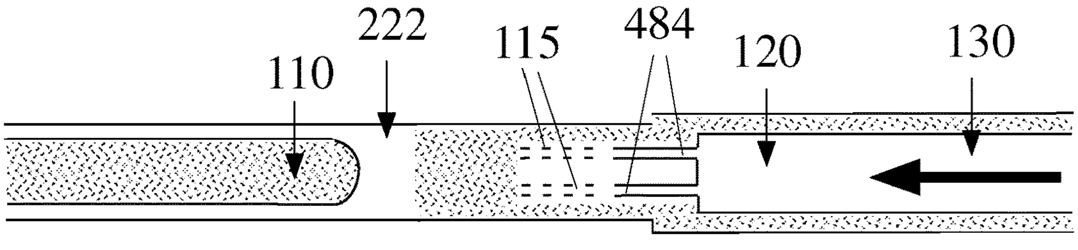
FIG. 4D

FIG. 5A
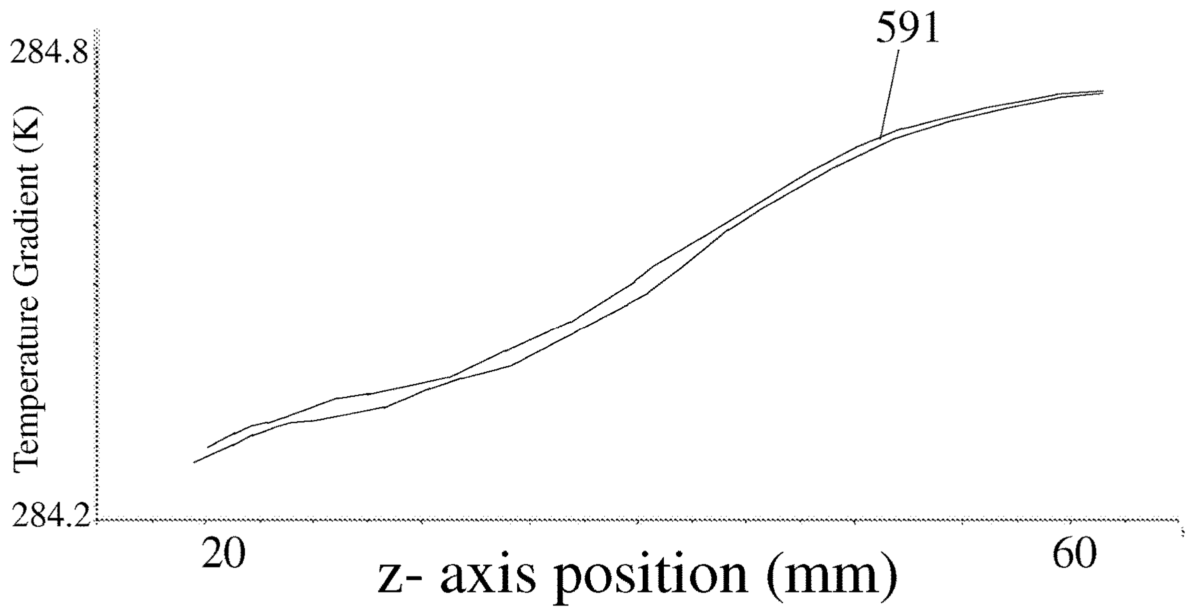
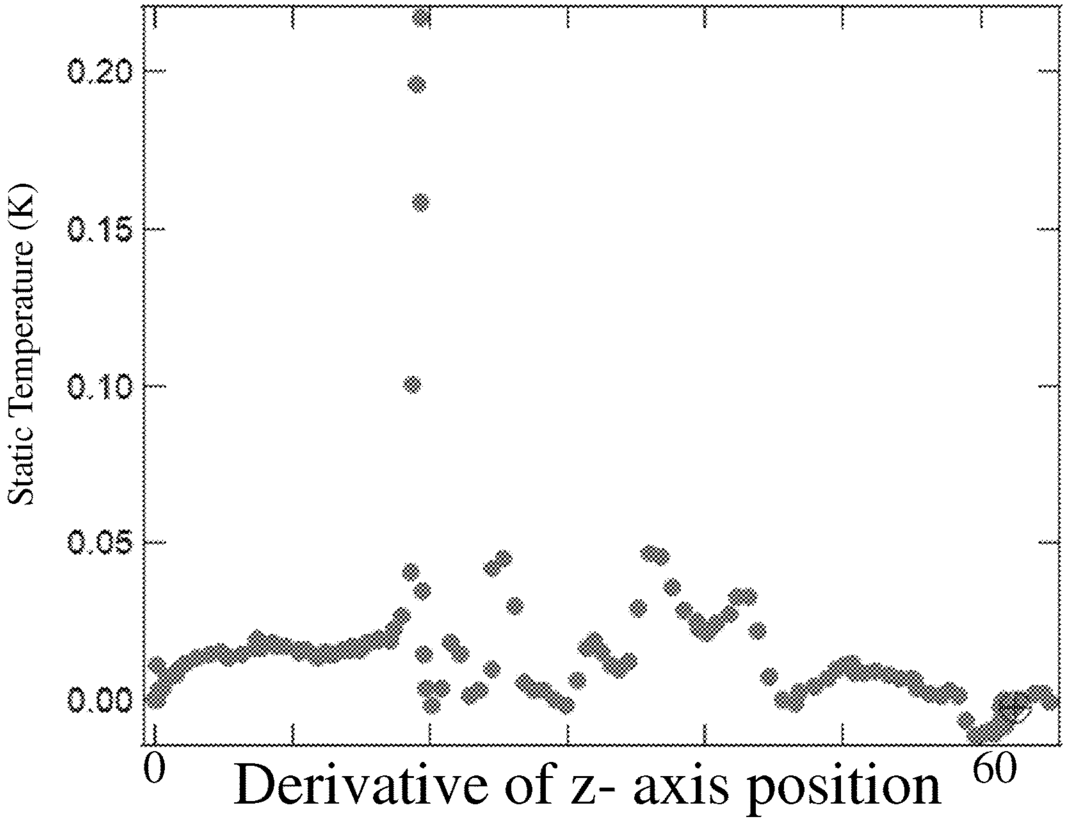
FIG. 5B

FIG. 5C
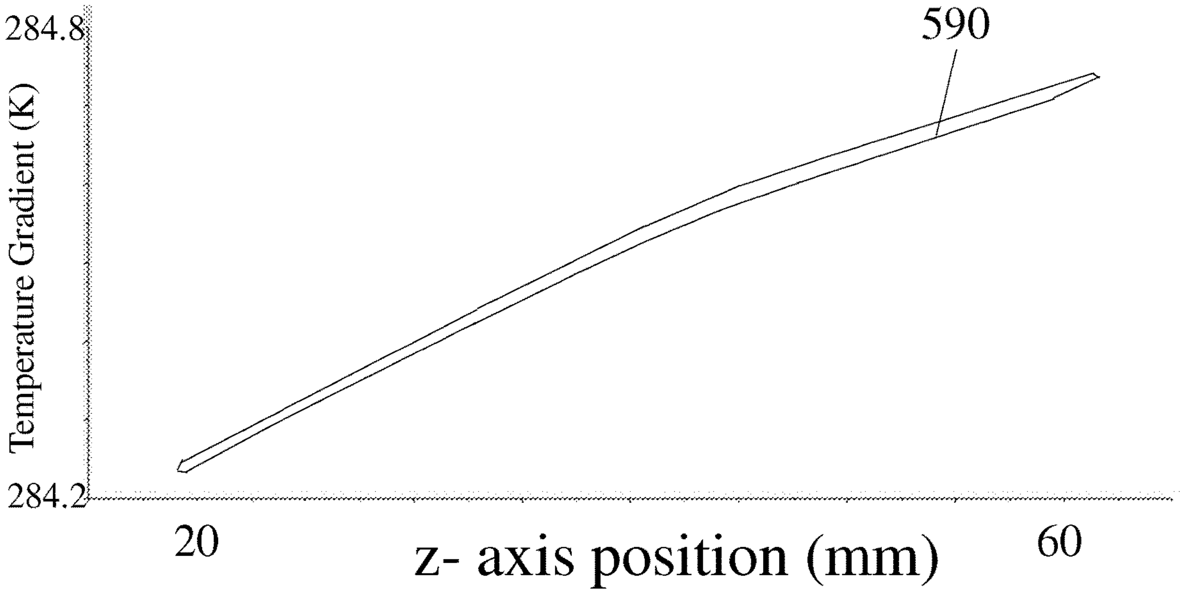
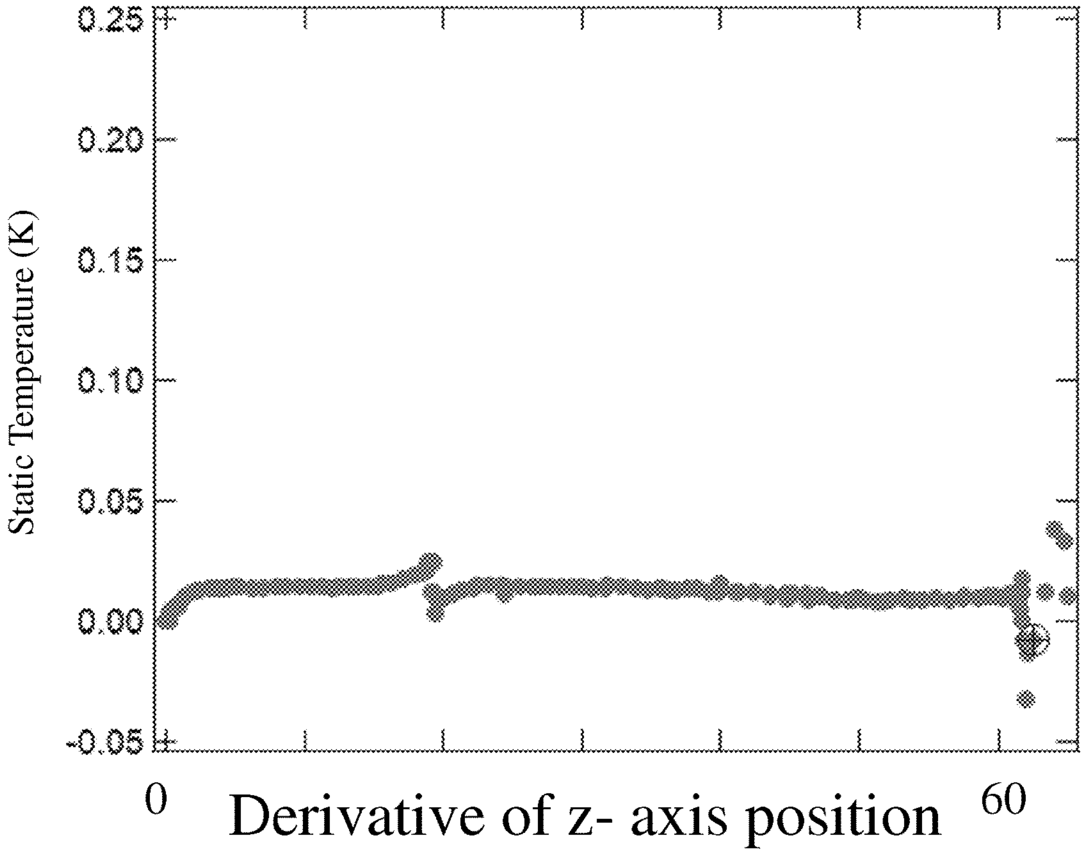
FIG. 5D
284.8
590
Temperature Gradient (K)
284.2
20
z- axis position (mm)
60
0.25
0.20
0.15
0.10
0.05
0.00
-0.05
Static Temperature (K)
0
Derivative of z- axis position
60

FIG. 6A
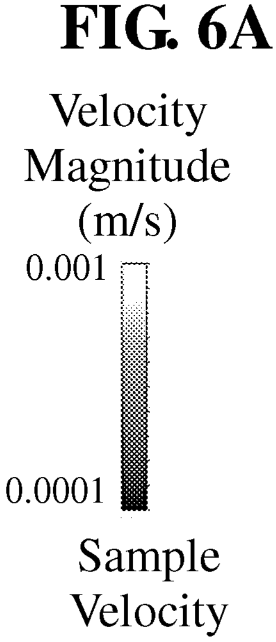
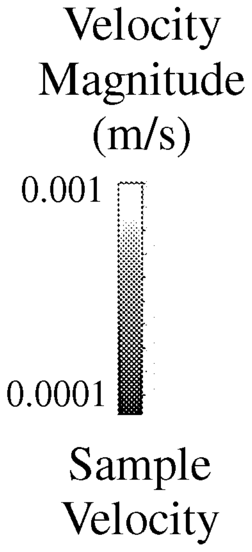
FIG. 6C

FIG. 6B
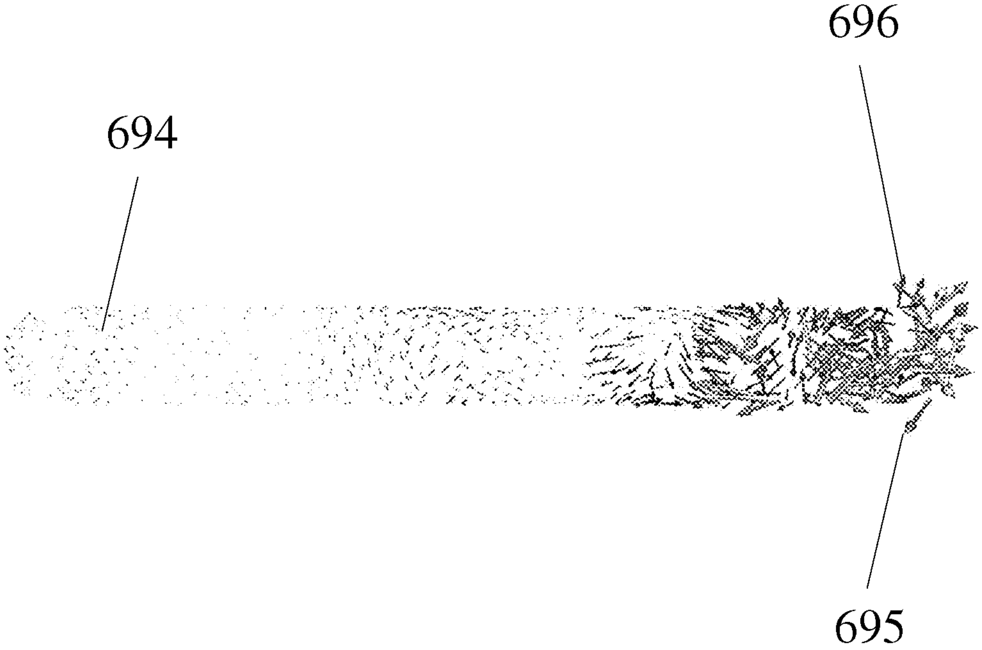
FIG. 6D

FIG. 7A
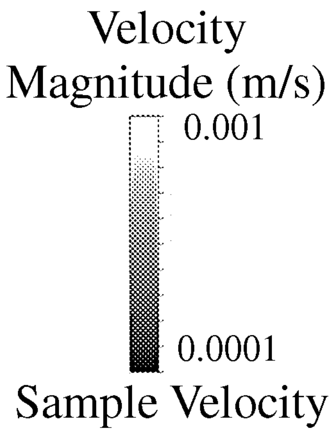
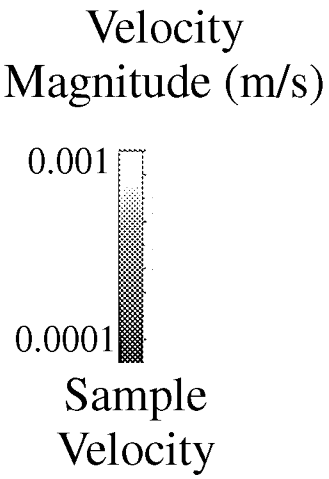
FIG. 7C

FIG. 7B
FIG. 7D

Velocity
Magnitude
(m/s)

Airflow
Velocity

Velocity
Magnitude
(m/s)

Airflow
Velocity

FIG. 9A
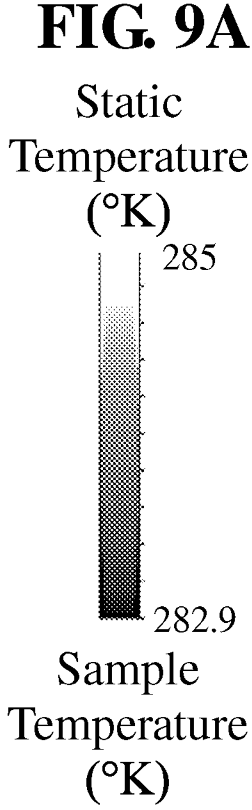
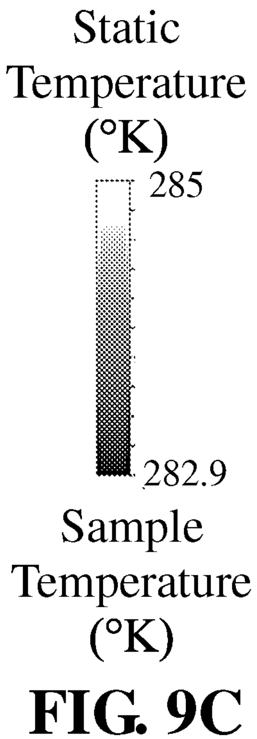
FIG. 9C

FIG. 9B
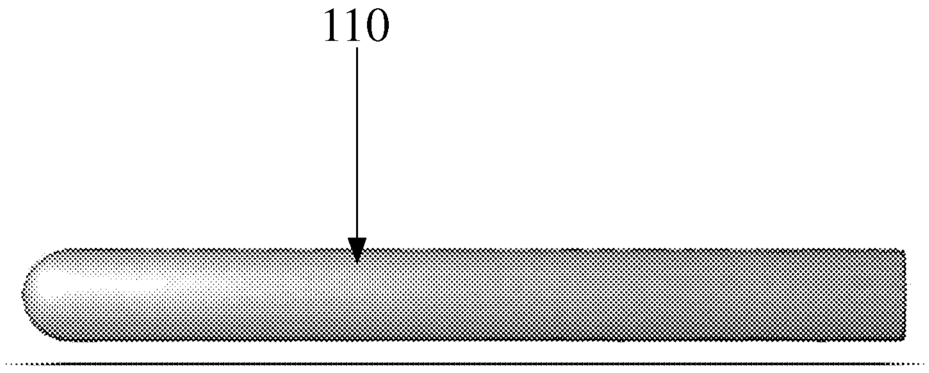
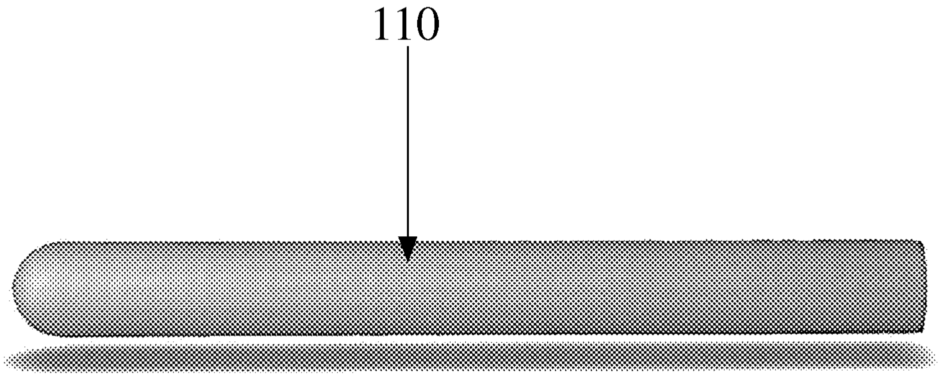
FIG. 9D

FIG. 10A
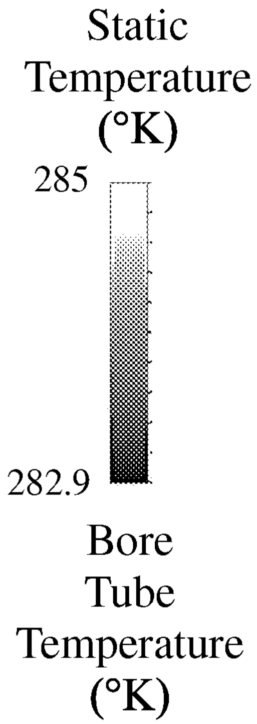
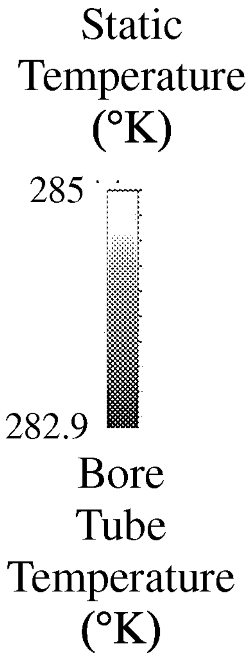
FIG. 10C

FIG. 10B
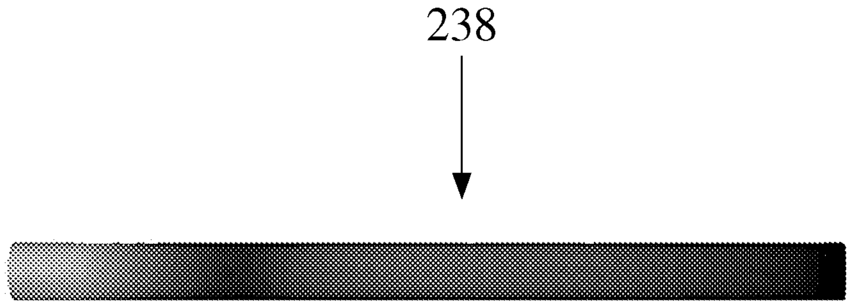
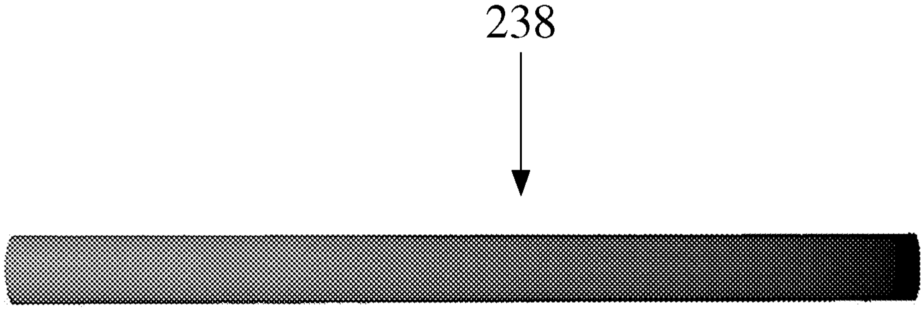
FIG. 10D

FIG. 11A
Static
Temperature
(°K)
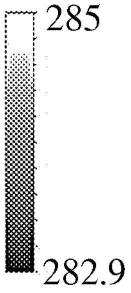
Airflow
Temperature
(°K)
Static
Temperature
(°K)
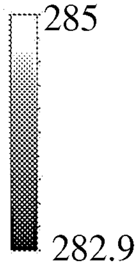
Airflow
Temperature
(°K)
FIG. 11C FIG. 11B
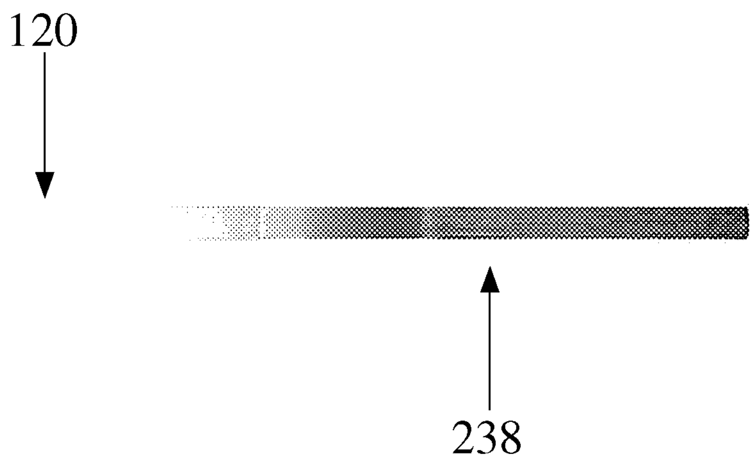
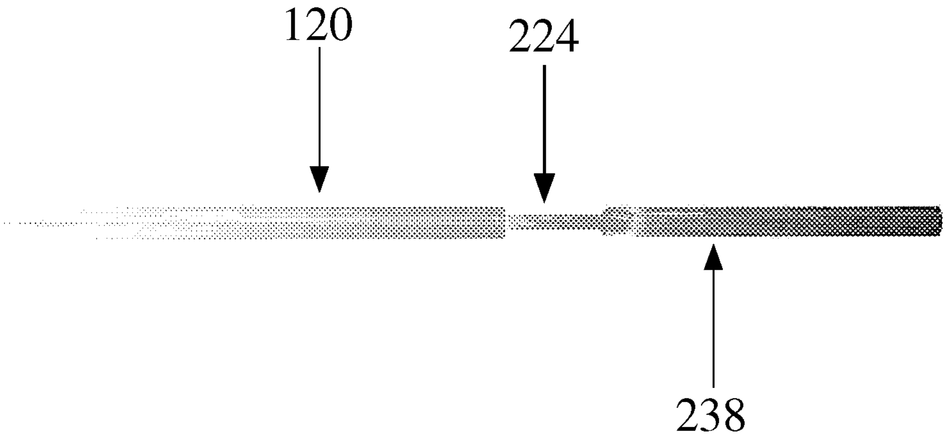
FIG. 11D FIG. 15A
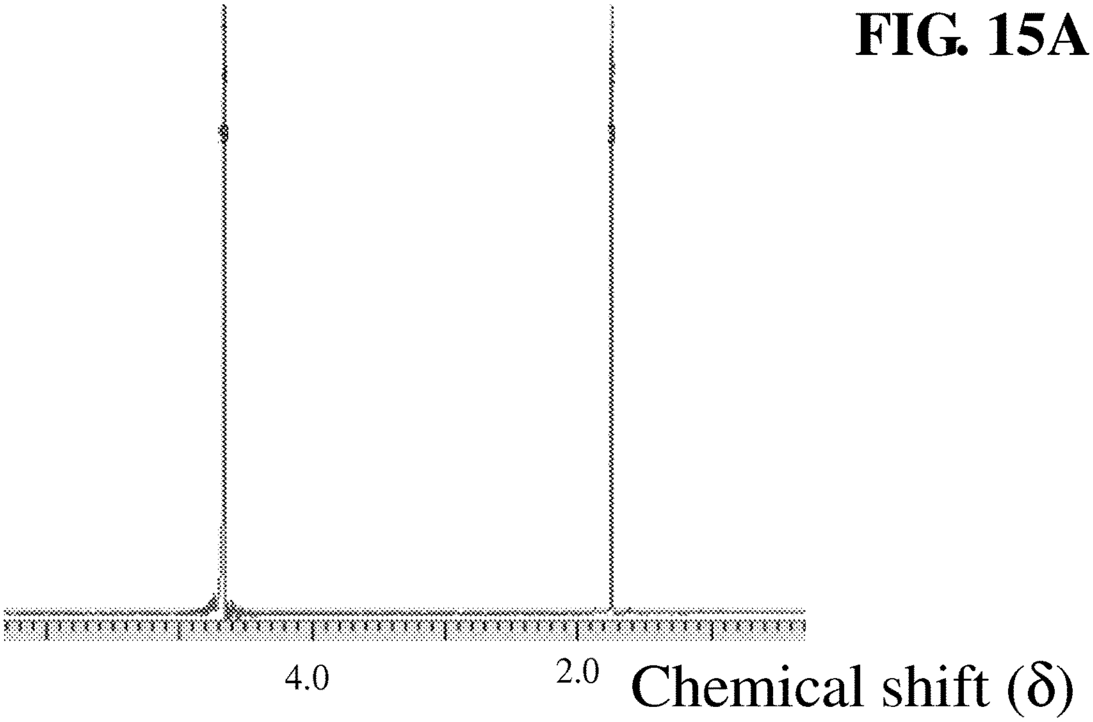
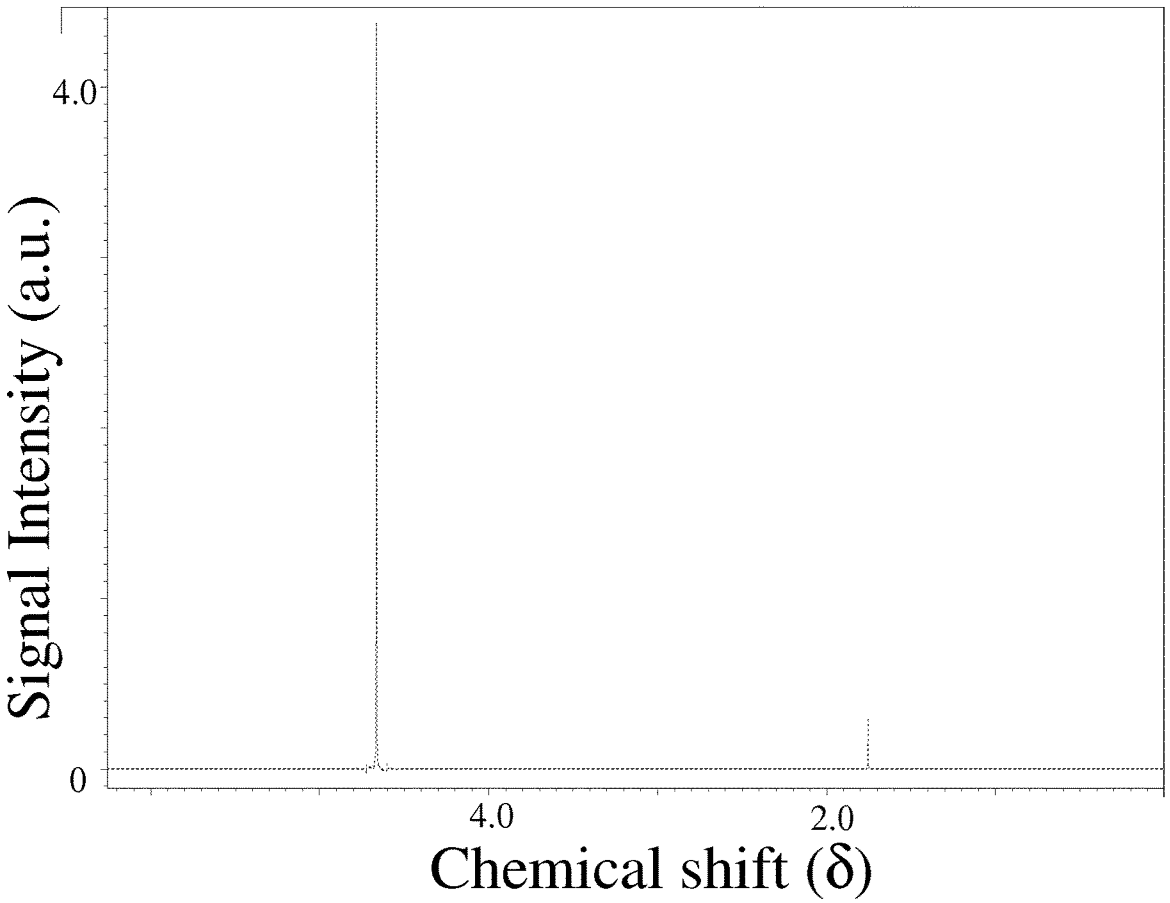
FIG. 15B

MODIFICATION OF AIR/FLUID FLOW AROUND NUCLEAR MAGNETIC RESONANCE PROBE AND METHODS OF USE

FIELD OF THE INVENTION

The present invention relates to methods and devices to modify the air/fluid flow around a sample in a high resolution nuclear magnetic resonance probe.

BACKGROUND OF THE INVENTION

Structural elucidation of a compound, whether a synthesis product or an extract from a natural source generally requires a number of analytical techniques. Infrared spectroscopy, mass spectrometry, and Nuclear Magnetic Resonance (NMR) spectroscopy can provide extensive chemical information. NMR can provide structural information and also information on both intermolecular and intramolecular dynamics. Applications of NMR range from determination of three-dimensional structures of large proteins to the analysis of very small amounts of products from combinatorial syntheses. Furthermore, NMR is a nondestructive analytical method.

NMR generally uses induction to detect the oscillating magnetic moment from nuclei precessing in a magnetic field. Because the signal from these precessing nuclei is inherently weak research efforts have been focused on improving the signal to noise ratio (SNR) obtained in NMR experiments. High resolution NMR probes typically have an 'inner coil' for irradiation and detection of a first nuclear species, and a second larger coil, coaxial with the inner coil, for irradiation of one or more other nuclear species. The two coils are typically oriented 90° with respect to each other to minimize coupling between the two coils.

There are two general ways to increase the SNR. One way is to increase the size of the magnetic field. While more powerful magnets, are increasingly being employed, currently superconducting magnets with up to 1.2 GHz are commercially available, there is an upper limit of the critical field of a superconducting magnet. The other way is to decrease the noise by cooling the coils and electronics used to detect the signal.

NMR sample cell centering devices that utilize the flow of air in a bore tube have previously been proposed, see U.S. Pat. No. 6,466,019 to D. Marek, issued Oct. 15, 2002 and U.S. Pat. No. 9,726,735 to D. Schmidig, et al., issued Aug. 8, 2017. Susceptibility matched plugs to eliminate convection artefacts have also been developed, see D. Doty et al., Magnetism in High-Resolution NMR Probe Design. I: General Methods, vol. 10, pp 133-156, 1998, John Wiley & Sons, Inc.

The use of cryogenically (liquid nitrogen or helium) cooled coils and electronics (i.e. cold probes) presents challenges in thermal management. A common problem during cold probe operation is the cooling of the sample through blackbody radiation heat transfer, known as thermal radiation. In thermal radiation, a cold/hot object can transfer heat without physically touching, so in the case of a cold probe, the cold coils can transfer cold to the sample without direct contact. When this occurs, the NMR sample has an uneven temperature distribution, resulting in thermal gradients. Thermal gradients cause solvent molecules of different temperatures to migrate, and this causes natural convection to occur in the NMR sample under these conditions. The convection currents are undesirable and lead to a loss of resolution and performance.

SUMMARY OF THE INVENTION

A limitation of using a cold probe of a sample in NMR spectroscopy is the thermal radiation inherent in the use of the cold probe and the resulting change in temperature of the sample creating a thermal gradient in the sample inducing natural convection. In an embodiment of the present invention, this limitation can be addressed by modifying the area directly below the sample to change the air/fluid flow characteristics around the sample. In an embodiment of the present invention, this limitation can be addressed by passing the air/fluid flow through a Reduced Section Variable Temperature Chamber (RSVTC) prior to the air/fluid flow contacting the sample.

In an embodiment of the present invention, by accelerating the variable temperature air before the air contacts the sample, the mass flow and thereby the heat transfer around the sample can be improved. In an embodiment of the present invention, by accelerating the variable temperature air, the heat caused by thermal radiation of the sample in the NMR field can be more efficiently removed thereby efficiently eliminating or minimizing natural convection in the sample. In an embodiment of the present invention, by passing the air/fluid flow through a RSVTC prior to the air/fluid flow contacting the sample, the heat caused by thermal radiation of the sample in the NMR field can be more efficiently removed thereby efficiently eliminating or minimizing natural convection in the sample.

In an embodiment of the present invention, by accelerating the variable temperature air before the air flow contacts the sample, the resulting NMR spectra show an increased performance. In an embodiment of the present invention, by accelerating the variable temperature air before the air flow contacts the sample, the resulting NMR spectra show an improved line shape. In an embodiment of the present invention, by accelerating the variable temperature air before the air flow contacts the sample, the resulting NMR spectra show an increased resolution.

In an embodiment of the present invention, by passing the air/fluid flow through a RSVTC prior to the air/fluid flow contacting the sample, the resulting NMR spectra show an increased performance. In an embodiment of the present invention, by passing the air/fluid flow through a dual RSVTC prior to the air/fluid flow contacting the sample, the resulting NMR spectra show an increased performance. In an embodiment of the present invention, by passing the air/fluid flow through a RSVTC prior to the air/fluid flow contacting the sample, the resulting NMR spectra show an improved line shape. In an embodiment of the present invention, by passing the air/fluid flow through a dual RSVTC prior to the air/fluid flow contacting the sample, the resulting NMR spectra show an improved line shape. In an embodiment of the present invention, by passing the air/fluid flow through a RSVTC prior to the air/fluid flow contacting the sample, the resulting NMR spectra show an increased resolution. In an embodiment of the present invention, by passing the air/fluid flow through a dual RSVTC prior to the air/fluid flow contacting the sample, the resulting NMR spectra show an increased resolution

BRIEF DESCRIPTION OF THE DRAWINGS

This invention is described with respect to specific embodiments thereof. Additional aspects can be appreciated from the Figures in which:

FIG. 2A is a schematic diagram showing a flow of variable temperature fluid/gas 130 which enters the region 120 at 226 and passes thru the reduced section 224 into the bore tube 238 and contacts the sample cell 110;

FIG. 2B is a schematic diagram showing the flow outlet pressure in the air gap region 236 between the sample tube wall 234 and the bore tube wall 238, according to an embodiment of the invention;

FIG. 2C is a schematic diagram showing the flow inlet 226 velocity to the Reduced Section Variable Temperature Chamber (RSVTC) device 111, the reduced section 224, leading to the bore tube 238, according to an embodiment of the invention;

FIG. 2D is a schematic diagram showing the surfaces used in the simulation to generate the surface mesh, according to an embodiment of the invention;

FIG. 2E is a showing the volumes used in the simulation to generate the volume mesh, according to an embodiment of the invention;

FIG. 4A is a schematic diagram of a portion of a probe inserted in a prior art device, where the sample cell 110 is inserted inside the bore tube 238, where a flow 130 of variable temperature fluid/gas is supplied from the chamber 120 into the bore tube 238;

FIG. 4B is a schematic diagram of a portion of a probe, where the sample cell 110 is in contact with a flow 130 of VT fluid/gas supplied from the chamber 120 that passes through the RSVTC device 111 exiting through the RSVTC 482 into the bore tube 238, according to an embodiment of the invention;

FIG. 4C is a schematic diagram of a portion of a probe, where the sample cell 110 is in contact with a flow 130 of VT fluid/gas supplied from the chamber 120 and passes through the dual RSVTC device 310 exiting through the RSVTCs 483 and through the flared section 113 into the bore tube 238, according to an embodiment of the invention;

FIG. 4D is a schematic diagram of a portion of a probe, where the sample cell 110 is in contact with a flow 130 of VT fluid/gas supplied from the chamber 120 and passes through the dual RSVTC device 320 exiting through a plurality of the RSVTCs 484 into an area with channels 115 and into the bore tube 238, according to an embodiment of the invention;

FIG. 5A is a plot 591 of temperature gradient as a function of the z-axis position of the bore tube 238 for the prior art device shown in FIG. 4A;

FIG. 5B shows the derivative of the z-axis position of the bore tube 238 as a function of temperature for the prior art device shown in FIG. 4A;

FIG. 5C is a plot 590 of the temperature gradient as a function of the z-axis position of the bore tube 238 for the RSVTC device 111 shown in FIG. 4B, according to an embodiment of the invention;

FIG. 5D shows the derivative of the z-axis position of the bore tube 238 as a function of temperature for the RSVTC device 111 shown in FIG. 4B, according to an embodiment of the invention;

FIG. 6A is a gray scale plot of the fluid (sample) velocity for use with FIG. 6B;

FIG. 6B is a gray scale plot of the travel path of the fluid (sample) inside the sample cell and the vector 692 with reference to the gray scale plot of FIG. 6A, where, the fluid is chloroform, for the prior art device shown in FIG. 4A;

FIG. 6C is a gray scale plot of the fluid (sample) velocity for use with FIG. 6D;

FIG. 6D is a gray scale plot of the velocity vector for the fluid (sample) where the intensity of the lines is defined by the gray scale plot of FIG. 6C, which shows the velocity vectors 694-696 at varying points as a function of time for the prior art device shown in FIG. 4A;

FIG. 7A is a gray scale plot of the fluid (sample) velocity for use with FIG. 7B;

FIG. 7B is a gray scale plot of the fluid (sample) velocity inside the sample cell and the velocity vector 792 with reference to the gray scale plot of FIG. 7A for the RSVTC device 111 shown in FIG. 4B, according to an embodiment of the invention;

FIG. 7C is a gray scale plot of the fluid (sample) velocity for use with FIG. 7D;

FIG. 7D gray scale plot of the fluid (sample) velocity inside the sample cell which shows the velocity vectors 794, 796 at varying points in the travel path of the sample as a function of time with reference to the gray scale plot of FIG. 7C for the RSVTC device 111 shown in FIG. 4B, according to an embodiment of the invention;

FIG. 9A is a gray scale plot of the sample temperature for use with FIG. 9B;

FIG. 9B is a gray scale schematic diagram of the sample temperature in the sample cell 110 of the device shown in FIG. 4A;

FIG. 9C is a gray scale plot of the sample temperature for use with FIG. 9D;

FIG. 9D is a gray scale schematic diagram of the sample temperature in the sample cell 110 of the RSVTC device 111 shown in FIG. 4B, according to an embodiment of the invention;

FIG. 10A is a gray scale plot of the bore tube temperature for use with FIG. 10B;

FIG. 10B is a schematic diagram of the bore tube 238 temperature of the device shown in FIG. 4A;

FIG. 10C is a gray scale plot of the bore tube temperature for use with FIG. 10D;

FIG. 10D is a schematic diagram of the bore tube 238 temperature of the RSVTC device 111 shown in FIG. 4B, according to an embodiment of the invention;

FIG. 11A is a gray scale plot of the air flow temperature for use with FIG. 11B;

FIG. 11B is a schematic diagram of the air flow temperature of the device shown in FIG. 4A;

FIG. 11C is a gray scale plot of the air flow temperature for use with FIG. 11D;

FIG. 11D is a schematic diagram of the air flow temperature of the RSVTC device 111 shown in FIG. 4B, according to an embodiment of the invention;

FIG. 15A shows an NMR spectrum of a 0.25% NaAc sample in 99.96% $D_2O$ measured with the device shown in FIG. 4A; and FIG. 15B shows an NMR spectrum of a 0.25% NaAc sample in 99.96% $D_2O$ measured with the RSVTC device 111 shown in FIG. 4B, according to an embodiment of the invention.

DETAILED DESCRIPTION OF THE INVENTION

Definitions

Figure 1:
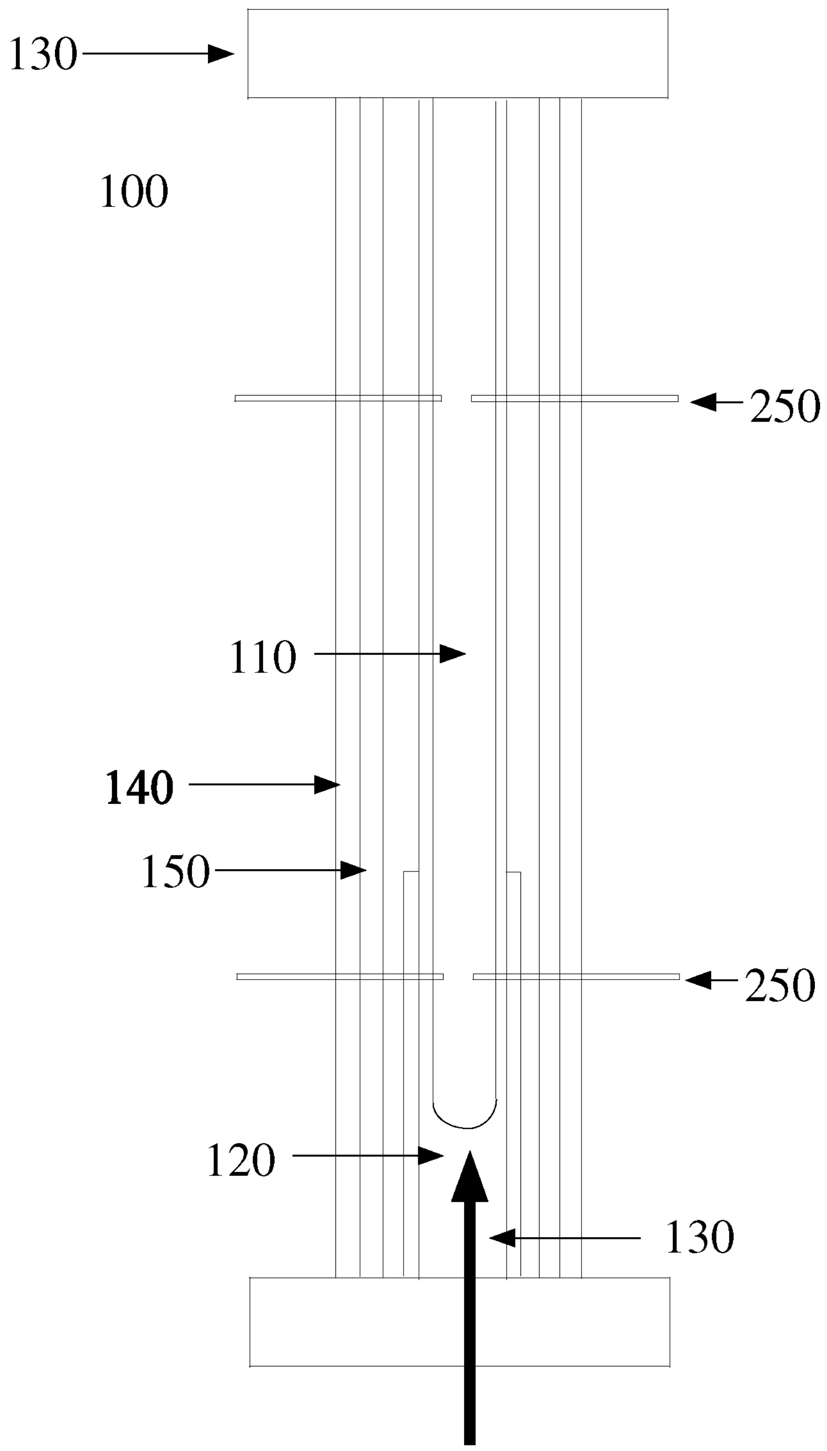
FIG. 1 is a schematic diagram of a prior art probe 100, where the sample cell 110 is within the RF window of the NMR coil and contacts with a flow of Variable Temperature (VT) fluid gas 130 in the region 120.

The transitional term 'comprising' is synonymous with 'including', 'containing', or 'characterized by', is inclusive or open-ended and does not exclude additional, unrecited elements or method steps.

The transitional phrase 'consisting of' excludes any element, step, or ingredient not specified in the claim, but does not exclude additional components or steps that are unrelated to the invention such as impurities ordinarily associated with a composition.

The transitional phrase 'consisting essentially of' limits the scope of a claim to the specified materials or steps and those that do not materially affect the basic and novel characteristic(s) of the claimed invention.

Whenever the term 'at least' precedes the first numerical value in a series of two or more numerical values, the term 'at least' applies to each of the numerical values in that series of numerical values. For example, at least 1, 2, or 3 is equivalent to at least 1, at least 2, or at least 3.

Whenever the term 'less than' precedes the first numerical value in a series of two or more numerical values, the term 'less than' applies to each of the numerical values in that series of numerical values. For example, less than 3, 2, or 1 is equivalent to less than 3, less than 2, or less than 1.

The terms 'coupled to', 'connected to', and 'in communication with', as used herein, generally refer to any form of interaction between two or more entities, including mechanical, electrical, magnetic, electromagnetic, fluid, biological, and thermal interaction. Two components can be coupled to each other even though they are not in direct contact with each other.

The phrase 'the NMR instrument' includes the magnet field characteristics of the NMR, e.g., the maximum magnet field intensity. The phrase 'the NMR probe' includes the size characteristics of the low temperature probe.

A 'sample cell' or a 'cell' means a vessel used to contain one or more of a homogeneous or heterogeneous liquid, gas or solid sample.

The word 'excitation' describes the disruption of the alignment of spins of nuclei in a sample in a static magnetic field ($B_0$) which occurs by applying an RF pulse at the Larmor frequency of the spins perpendicular to the magnetic field ($B_1$).

The word 'performance' means the SNR of an NMR spectrum produced by a circuit with respect to the parent mode(s).

The word 'conduit' means an enclosed passage, e.g., a tube.

The phrase 'reduced section' and 'reduced section chamber' in the context of a RSVTC device means a conduit where the fluid/gas moves through the conduit and encounters a region with a smaller passageway. That is, a 'reduced section' or 'reduced section chamber' means a tube with a diameter (d) where the fluid/gas moves through the tube and encounters a region with a smaller diameter tube than d. That is, the smaller diameter tube is the reduced section 224. For example, in FIG. 4B, the diameter of the tube at 224 is smaller than the diameter of the tube at the region 120. A gas flow 130 entering the tube at region 120 and flowing towards the bore tube 238, experiences the RSVTC device 111 with the reduced section 224. In flowing into the RSVTC 482 the fluid/gas expands when exiting the RSVTC device 111 and entering region 222.

The phrase 'Reduced Section Variable Temperature Chamber' or acronym 'RSVTC' means a device designed to be located in the bore tube that incorporates a 'reduced section' (vide supra) and/or a 'reduced flow region' (vide infra) and directs the fluid/gas movement to contact the outer wall 234 of the sample cell 110. The term 'RSVTC' or 'RSVTCs' can be used to designate both the chambers (e.g., 482 in FIG. 2A or 484 in FIG. 3B) and/or the device (e.g., 111 in FIG. 2A or 320 in FIG. 3B). Each of the RSVTC devices 111, 310 and 320 include at least a RSVTC 482, 483 and 484. The RSVTC can be located anywhere in the bore tube such that it is capable of directing the fluid/gas movement to contact the outer wall 234 of the sample cell 110. The RSVTC device 111 incorporates a reduced section 224 and directs the fluid/gas movement such that it contacts the outer wall 234 of the sample cell 110.

The phrase 'reduced flow region' in the context of a RSVTC device means a device incorporating a cone, a channel, a surface or a volume through which the fluid/gas movement flow is directed and thereby the fluid/gas is restricted. The dual RSVTC devices 310 and 320 incorporate both a reduced section and a reduced flow region 113 and 115 that direct the fluid/gas movement such that it contacts the outer wall 234 of the sample cell 110. That is, the dual RSVTC devices 310 and 320 include either a cone or plurality of channels 113 and 115 that direct the fluid/gas movement such that it contacts the outer wall 234 of the sample cell 110.

Absent express recitation to the contrary, the term 'approximately' means a nominal value plus or minus ten (10) percent thereof.

In the last 20 years cooling the coils has been the major focus of NMR research. For example, to provide improved sensitivity the electronics for signal detection can be cryo-cooled. NMR sensitivity increases as the sample temperature is lowered. Therefore, it is advantageous to cool a sample. A sample can be spun to improve the observed NMR line shapes and resolution. A VT gas/fluid can be applied to a sample to ensure sample spinning. A limitation of using a cold probe of a sample in NMR spectroscopy is the thermal radiation inherent in the use of the cold probe and the resulting change in temperature of the sample creating a thermal gradient in the sample inducing natural convection. In an embodiment of the present invention, this limitation can be addressed by modifying the area directly below the sample to change the air/fluid flow characteristics around the sample. FIG. 1 is a schematic diagram of a prior art probe 100, where the sample cell 110 is within the RF window of the NMR coil and contacts with a flow of variable temperature fluid gas 130 in the region 120.

In the following description, various aspects of the present invention are described. However, it will be apparent to those skilled in the art that the present invention can be practiced with only some or all aspects of the present invention. For purposes of explanation, specific numbers, materials, and configurations are set forth to provide a thorough understanding of the present invention. However, it will be apparent to one skilled in the art that the present invention can be practiced without the specific details. In other instances, well-known features are omitted or simplified in order not to obscure the present invention.

Parts of the description are presented in data processing terms, such as data, selection, retrieval, generation, and so forth, consistent with the manner commonly employed by those skilled in the art to convey the substance of their work to others skilled in the art. As is well understood by those skilled in the art, these quantities (data, selection, retrieval, generation) can take the form of electrical, magnetic, or optical signals capable of being stored, transferred, combined, and otherwise manipulated through electrical, optical, and/or biological components of a processor and its subsystems.

Various operations are described as multiple discrete steps in turn, in a manner that is helpful in understanding the present invention; however, the order of description should not be construed as to imply that these operations are necessarily order dependent.

Various embodiments are illustrated in terms of exemplary classes and/or objects in an object-oriented programming paradigm. It will be apparent to one skilled in the art that the present invention can be practiced using any number of different classes/objects, not merely those included here for illustrative purposes.

Aspects of the invention are illustrated by way of example and not by way of limitation in the figures of the accompanying drawings in which like references indicate similar elements. It should be noted that references to 'an' or 'one' embodiment in this disclosure are not necessarily to the same embodiment, and such references mean at least one.

EXAMPLES

Example 1

Computational Fluid Dynamics Simulations

Computational Fluid Dynamics (CFD) uses defined structures and simulated fluid flows that are calculated through numerical analysis to simulate a free-stream flow of the fluid, and the interaction of the fluid (liquids and gases) with surfaces defined by boundary conditions. In the FIGS shown in FIG. 5-FIG. 12 ANSYS Fluent software is used to simulate air/fluid flow in NMR probes. The ANSYS Fluent software solves equations of motions for air/fluid, as well as energy equations (e.g. heat or momentum transfer).

In order to use the ANSYS Fluent software, meshing and definitions are input. FIG. 2A is a schematic diagram showing the probe including the region 120, the RSVTC 482 corresponding to the reduced section 224, the bore tube region 222 in the bore tube 238, where a flow of variable temperature fluid/gas 130 enters the region 120 at 226 passes thru the reduced section 224 into the bore tube 238 and contacts the sample cell 110. Firstly, the simulation requires both the surface and volume meshes, the flow inlet, flow outlet and the solid/fluid zones to be generated. FIG. 2D is a schematic diagram showing the simulation to generate the surface mesh. FIG. 2E is a schematic diagram showing the simulation to generate the volume mesh.

In FIG. 2D region 120 is designated with a first specific surface (r to 1 diagonal stripe), the reduced section chamber 254 is designated with a second specific surface (dots), the sample cell 110 is designated with a third specific surface (large dots), and the bore tube region before the sample cell 256, and after the sample cell 258, are designated with a fourth specific surface (1 to r diagonal stripe). In FIG. 2E region 120, the reduced section volume, and the bore tube region before the sample cell 262 is designated with a first specific volume (r to 1 thin diagonal stripe), the sample cell 110 is designated with a second specific volume (large dots), and the bore tube region after the sample cell 258 is designated with a third specific volume. FIG. 2B is a schematic diagram showing the flow outlet pressure in the air gap region 236 between the sample tube wall 234 and the bore tube wall 238. FIG. 2C is a schematic diagram showing the flow inlet 226 velocity from region 120 via the reduced section 224, towards the bore tube 238. Next, the appropriate materials are assigned to each solid or fluid, the inlet velocity and temperature are defined, and any heat input such as thermal radiation is also defined. Finally, gravity and fluid density change is enabled to allow for sample convection. The calculation is initialized and commenced. The calculation is completed when residuals of important parameters have converged.

FIG. 4A is a schematic diagram of a portion of a probe inserted in a prior art device, where the sample cell 110 is inserted inside the bore tube 238, where a flow 130 of variable temperature fluid gas is supplied from the region 120 through the liquid/gas supplying tube 114 into the bore tube area 222. As shown in FIG. 4A the region 222 in the bore tube 238 is configured with the same ID diameter as the liquid/gas supplying tube 114 for the simulation.

In an embodiment of the present invention, FIG. 4B is a schematic diagram of a portion of a probe, where the sample cell 110 is in contact with a flow 130 of variable temperature fluid gas supplied from the region 120 and passes through the RSVTC 482 into the bore tube area 222. As shown in FIG. 4A the region 120 (ID diameter from 6.4 mm) is followed by a reduced section 224 where the ID diameter of the RSVTC 482 is reduced to 3 mm. The air flows through the reduced section 224 into the bore tube region 222 and passes around the sample cell 110 through the air gap region 236. The reduced section 224 is a distance 221, 6.4 mm away from the sample cell 110 for the simulation.

FIG. 5A is a plot 591 of temperature gradient as a function of the z-axis position along the bore tube 238 for the prior art device shown in FIG. 4A. FIG. 5B shows the derivative of the change in temperature data with respect to position shown in FIG. 5A (i.e., the derivative of the z-axis position along the bore tube 238 as a function of temperature for the prior art device shown in FIG. 4A).

FIG. 5C is a plot 590 of the temperature gradient as a function of the z-axis position of the bore tube 238 for the RSVTC device 111 device in FIG. 4B. In an embodiment of the present invention, FIG. 5D shows the derivative of the z-axis position of the bore tube 238 as a function of temperature for the RSVTC device 111 shown in FIG. 4B. The temperature gradient across z-axis is similar but the RSVTC device 111 shown in FIG. 4B has a more linear temperature gradient. Further, there is a distinct difference between the temperature position plot of FIG. 5A compared with the smooth increase in FIG. 5C, the derivative (plotted on the same scale) clearly shows the peak at approximately 20 mm in FIG. 5B, that is absent in FIG. 5D. Unexpectedly, the larger scatter in values (large deviation of 0.03 K on average between 15 mm and 49 mm, with a maximum of 0.22 K at the peak at 19.2 mm) compared to the invention (0.01 K on average throughout the whole region) is an important difference between the device shown in FIG. 4A and the RSVTC device 111 shown in FIG. 4B.

FIG. 6A is a gray scale plot of the fluid (sample) velocity for use with FIG. 6B. FIG. 6B is a gray scale plot of the fluid (sample) velocity inside the sample cell and the velocity vector 692 with reference to the gray scale plot of FIG. 6A, where, the fluid is chloroform, for the prior art device shown in FIG. 4A. FIG. 6C is a gray scale plot of the fluid (sample) velocity for use with FIG. 6D. FIG. 6D gray scale plot of the fluid (sample) velocity inside the sample cell which shows the velocity vectors 694-696 at varying points in the travel path of the sample as a function of time with reference to the gray scale plot of FIG. 6C, for the prior art device shown in FIG. 4A. Both FIG. 6B and FIG. 6D depict that the fluid is traveling in a non-linear fashion. Further, in FIG. 6B and FIG. 6D, the presence of vortices in the fluid is shown clearly. The vortices indicate that there is strong sample convection present in the prior art device shown in FIG. 4A.

FIG. 7A is a gray scale plot of the fluid (sample) velocity for use with FIG. 7B. In an embodiment of the present invention, FIG. 7B is a gray scale plot showing the travel path of the fluid as a function of time inside the sample cell and the vector 792 (in which the line gray scale can be referenced to the gray scale plot of FIG. 7A) for the RSVTC device 111 shown in FIG. 4B. FIG. 7C is a gray scale plot of the fluid (sample) velocity for use with FIG. 7D. In an embodiment of the present invention, FIG. 7D is a gray scale plot of the velocity vector map for the fluid (sample) velocity inside the sample cell and shows the velocity vectors 794, 796 at varying points in the travel path of the sample as a function of time (in which the line gray scale can be referenced to the gray scale plot of FIG. 7C) for the RSVTC device 111 shown in FIG. 4B. In FIG. 7B and FIG. 7D the fluid path is very linear and the velocity map shows very little movement of the fluid (possibly no movement of the fluid at all). This clearly indicates that there is no significant sample convection in the RSVTC device 111 shown in FIG. 4B.

Figure 8A:
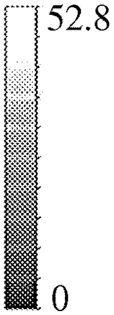
FIG. 8A is a gray scale plot of the airflow velocity magnitude for use with FIG. 8B and FIG. 8C.
Figure 8D:
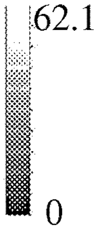
FIG. 8D is a gray scale plot of the airflow velocity magnitude for use with FIG. 8E and FIG. 8F.
Figure 8C:
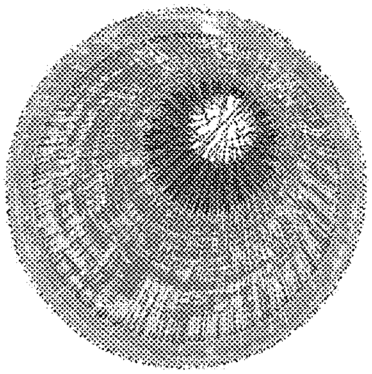
FIG. 8C is a gray scale schematic diagram of the airflow velocity along the axis of the bore tube 238 of the device shown in FIG. 4A.
Figure 8F:
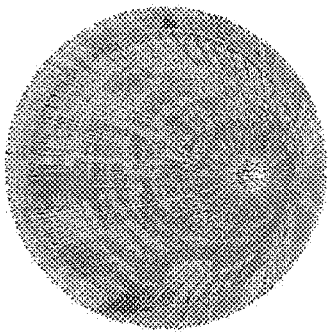
FIG. 8F is a gray scale schematic diagram of the airflow velocity along the axis of the bore tube 238 of the RSVTC device 111 shown in FIG. 4B, according to various embodiments of the invention.
Figure 8B:
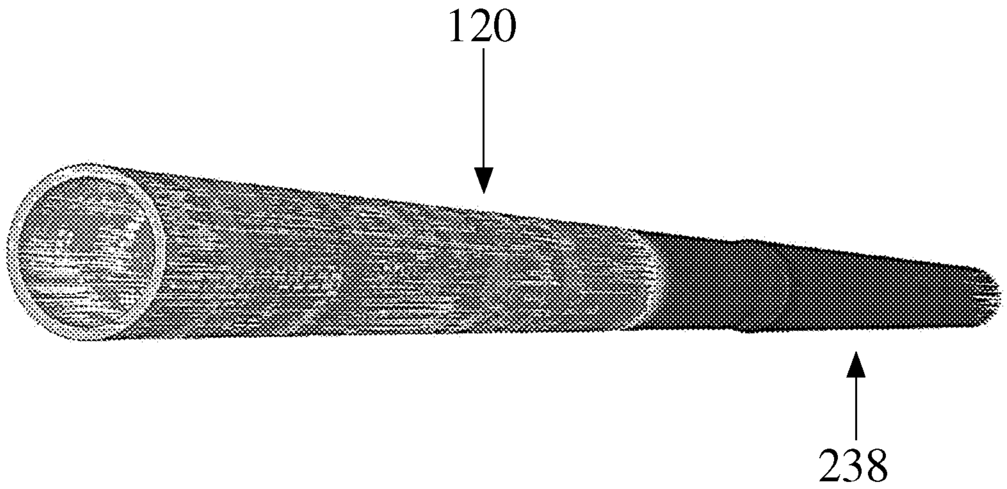
FIG. 8B is a gray scale schematic diagram of the airflow velocity from region 120 to the bore tube 238 of the device shown in FIG. 4A around the sample cell 110.

FIG. 8A is a gray scale plot of the airflow velocity magnitude for use with FIG. 8B and FIG. 8C. FIG. 8B is a gray scale schematic diagram of the airflow velocity from region 120 to the bore tube 238 of the device shown in FIG. 4A around the sample cell 110. FIG. 8C is a gray scale schematic diagram of the airflow velocity along the axis of the bore tube 238 of the device shown in FIG. 4A. The air velocity is low in the cold zone (transition zone) of the prior art device shown in FIG. 4A.

Figure 8E:
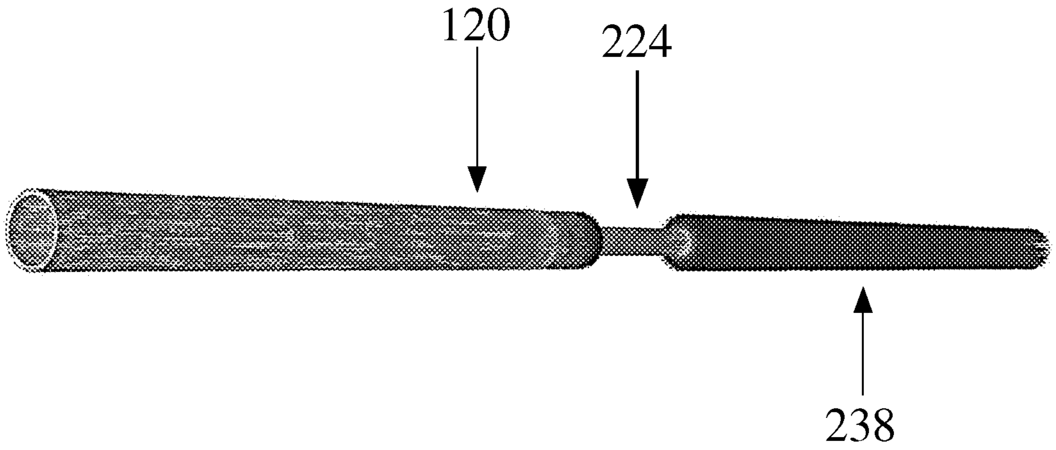
FIG. 8E is a gray scale schematic diagram of the airflow velocity from region 120 through the reduced section 224 to the bore tube 238 of the RSVTC device 111 shown in FIG. 4B around the sample cell 110, according to various embodiments of the invention.

FIG. 8D is a gray scale plot of the airflow velocity magnitude for use with FIG. 8E and FIG. 8F. In an embodiment of the present invention, FIG. 8E is a gray scale schematic diagram of the airflow velocity from region 120 through the reduced section 224 to the bore tube 238 of the RSVTC device 111 shown in FIG. 4B around the sample cell 110. In an embodiment of the present invention, FIG. 8F is a gray scale schematic diagram of the airflow velocity along the axis of the bore tube 238 of the RSVTC device 111 shown in FIG. 4B. The air velocity is high in the transition zone in the RSVTC device 111 shown in FIG. 4B.

FIG. 9A is a gray scale plot of the sample temperature for use with FIG. 9B. FIG. 9B is a gray scale schematic diagram of the sample temperature in the sample cell 110 of the device shown in FIG. 4A. The temperature is very uneven in the prior art device.

FIG. 9C is a gray scale plot of the sample temperature for use with FIG. 9D. In an embodiment of the present invention, FIG. 9D is a gray scale schematic diagram of the sample temperature in the sample cell 110 of the RSVTC device 111 shown in FIG. 4B. The temperature is much more even in FIG. 9D for the RSVTC device 111 shown in FIG. 4B compared with FIG. 9B (the prior art device).

FIG. 10A is a gray scale plot of the bore tube temperature for use with FIG. 10B. FIG. 10B is a schematic diagram of the bore tube 238 temperature of the device shown in FIG. 4A. The device shown in FIG. 4A has a number of hot and cold zone transition regions.

FIG. 10C is a gray scale plot of the bore tube temperature for use with FIG. 10D. In an embodiment of the present invention, FIG. 10D is a schematic diagram of the bore tube 238 temperature of the RSVTC device 111 shown in FIG. 4B. The temperature in the bore tube 238 in FIG. 10D is more even than in FIG. 10B. The bore tube temperature shown in FIG. 10D further supports that the heat transfer is enhanced with the RSVTC device 111 shown in FIG. 4B. It is not only able to extract heat better from the sample cell but also from components surrounding the sample, which is the bore tube in this case.

FIG. 11A is a gray scale plot of the air flow temperature for use with FIG. 11B. FIG. 11B is a schematic diagram of the air flow temperature of the device shown in FIG. 4A. There is a cold zone in the transition zone right below the sample cell, after exiting the bore tube in the device shown in FIG. 4A.

FIG. 11C is a gray scale plot of the air flow temperature for use with FIG. 11D. In an embodiment of the present invention, FIG. 11D is a schematic diagram of the air flow temperature of the RSVTC device 111 shown in FIG. 4B. The air temperature is generally warmer across all sections in the RSVTC device 111 shown in FIG. 4B (FIG. 11D).

Figure 12A:
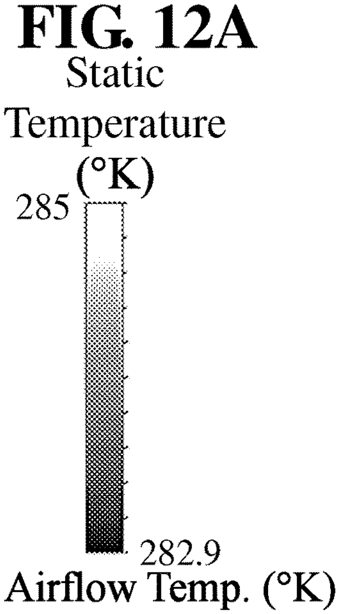
FIG. 12A is a gray scale plot of the airflow temperature for use with FIG. 12B and FIG. 12C.
Figure 12D:
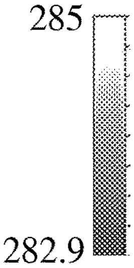
FIG. 12D is a gray scale plot of the airflow velocity magnitude for use with FIG. 12E and FIG. 12F.
Figure 12C:
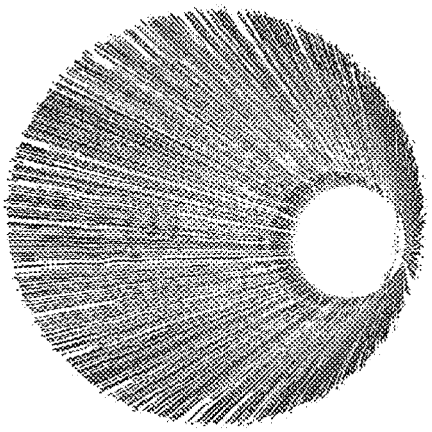
FIG. 12C is a gray scale schematic diagram of the airflow temperature along the axis of the bore tube 238 of the device shown in FIG. 4A.
Figure 12F:
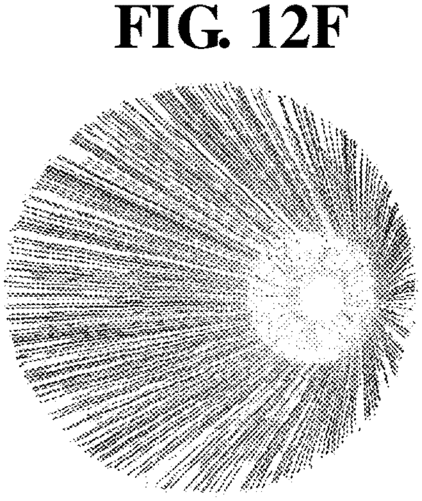
FIG. 12F is a gray scale schematic diagram of the airflow velocity along the axis of the bore tube 238 of the RSVTC device 111 shown in FIG. 4B, according to various embodiments of the invention.
Figure 12B:
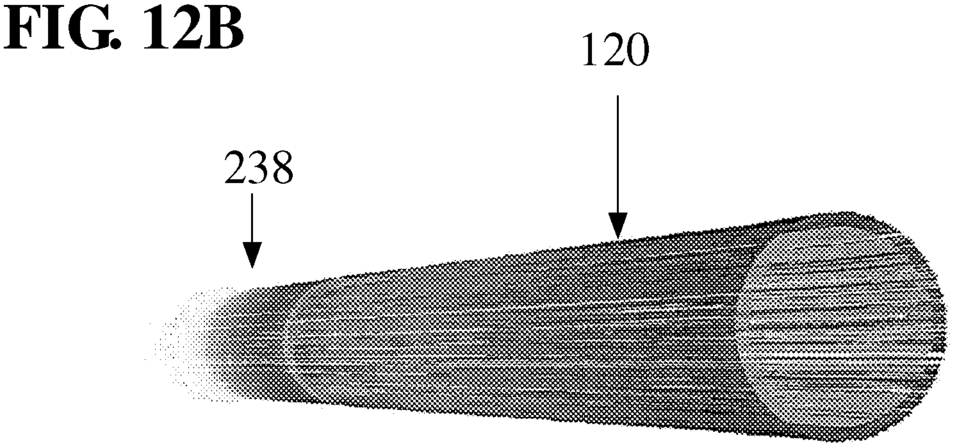
FIG. 12B is a gray scale schematic diagram of the airflow temperature from region 120 to the bore tube 238 of the device shown in FIG. 4A around the sample cell 110.

FIG. 12A is a gray scale plot of the airflow temperature for use with FIG. 12B and FIG. 12C. FIG. 12B is a gray scale schematic diagram of a close up of the airflow temperature from the region 120 to the bore tube 238 of the device shown in FIG. 4A around the sample cell 110. FIG. 12C is a gray scale schematic diagram of a close up of the airflow temperature along the axis of the bore tube 238 of the device shown in FIG. 4A. The cold zone is very clearly seen in FIG. 12B at the intersection of the region 120 and the bore tube 238.

Figure 12E:
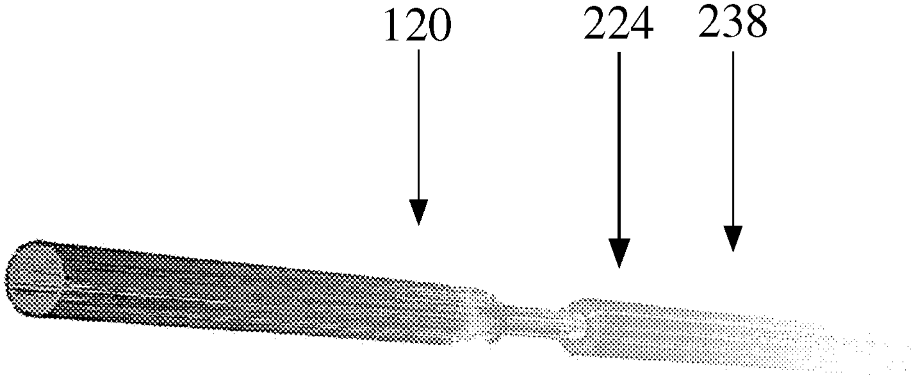
FIG. 12E is a gray scale schematic diagram of the airflow temperature from region 120 through the reduced section 224 to the bore tube 238 of the RSVTC device 111 shown in FIG. 4B around the sample cell 110, according to various embodiments of the invention.

FIG. 12D is a gray scale plot of the airflow velocity magnitude for use with FIG. 12E and FIG. 12F. In an embodiment of the present invention, FIG. 12E is a gray scale schematic diagram of a close up of the airflow temperature from region 120 through the reduced section 224 to the bore tube 238 of the RSVTC device 111 shown in FIG. 4B around the sample cell 110. FIG. 12F is a gray scale schematic diagram of a close up of the airflow velocity along the axis of the bore tube 238 of the RSVTC device 111 shown in FIG. 4B. No cold zone is seen in FIG. 12E at the reduced section chamber 224 and in particular after the region 120 and in the bore tube 238.

CFD calculations were consistent with experimental observation that the RSVTC device 111 shown in FIG. 4B has no sample convection issue, while the device shown in FIG. 4A shows strong sample convection. CFD calculations reveal that an air acceleration zone could be a key design principle for improving heat transfer at the sample.

Example 2

Broadening and Splitting of Resonance

Figure 13A:
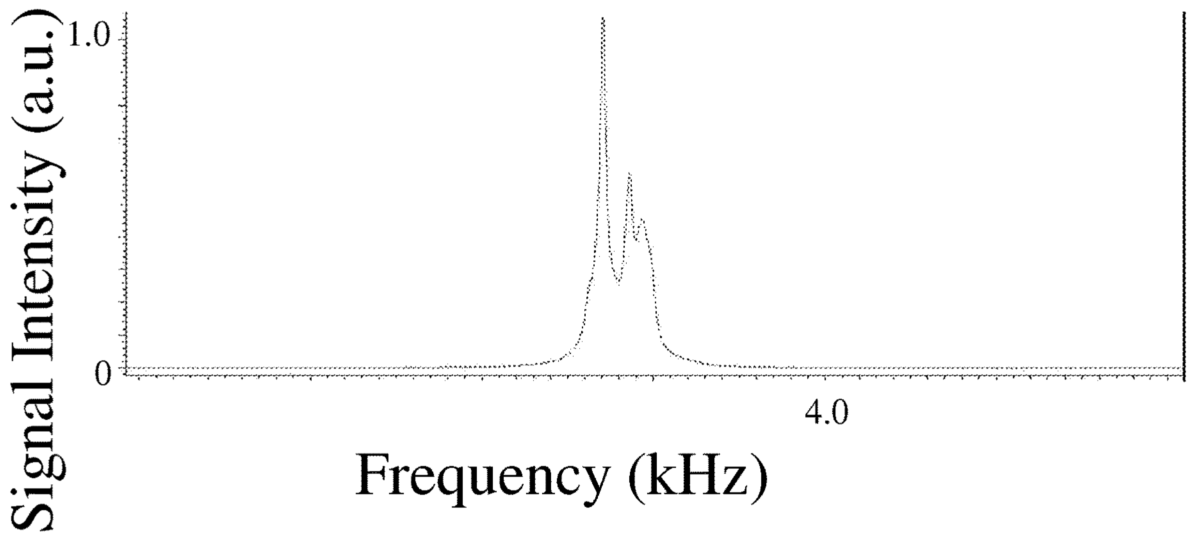
FIG. 13A shows an NMR spectrum of a 1% chloroform sample in acetone measured with the device shown in FIG. 4A.
Figure 13B:
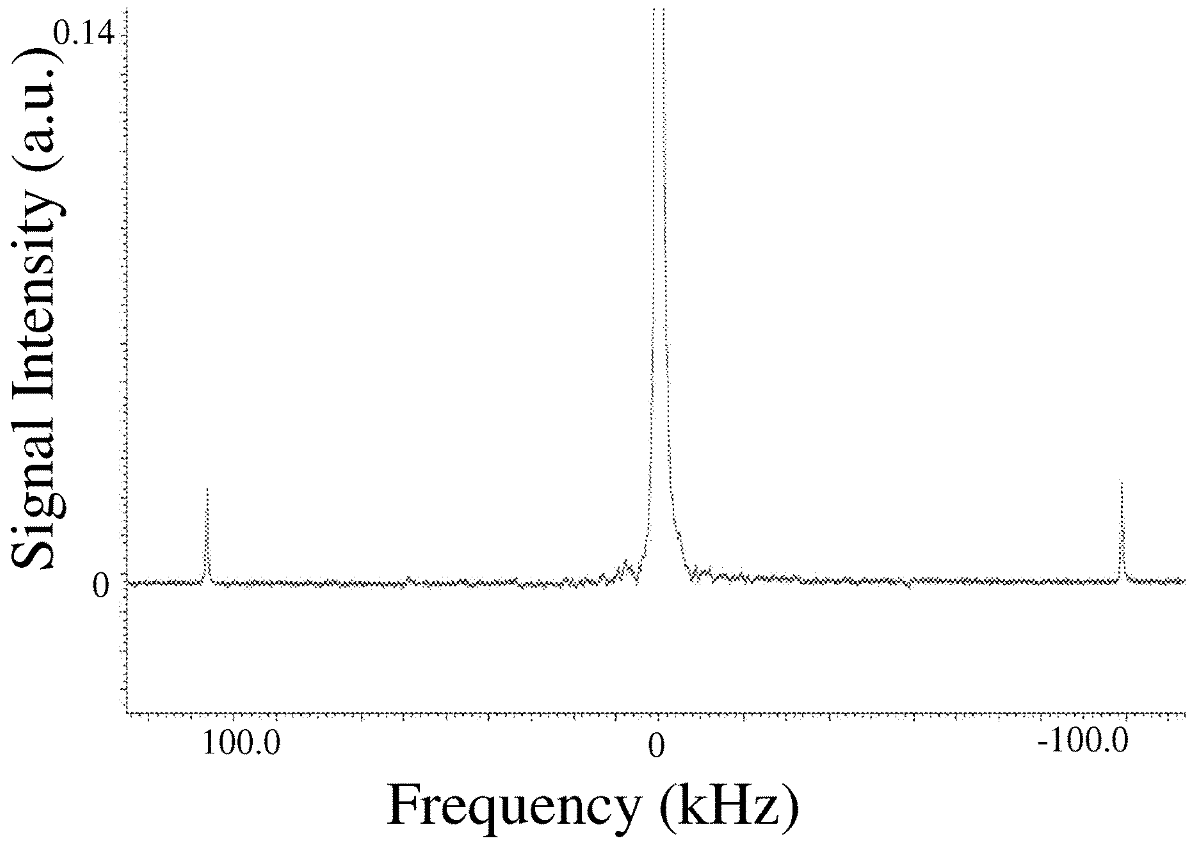
FIG. 13B shows an NMR spectrum of a 1% chloroform sample in acetone measured with the RSVTC device 111 shown in FIG. 4B, according to an embodiment of the invention.

FIG. 13A shows an NMR spectrum of a 1% chloroform sample at room temperature (291-294° K) in acetone measured with the device shown in FIG. 4A. When an NMR signal is acquired with the device shown in FIG. 4A, sample convection is present. As a result, the signal can be split into many peaks because the position of the sample molecules is changing during signal acquisition, resulting in both broadening and splitting of a single NMR peak. This can obscure chemical identification of the sample. According to an embodiment of the present invention, FIG. 13B shows an NMR spectrum of a 1% chloroform sample in acetone at room temperature (291-294° K) measured with the RSVTC device 111 shown in FIG. 4B. When an NMR signal is acquired with the RSVTC device 111 shown in FIG. 4B, no sample convection is present. Without sample convection, the NMR signal is narrow and the chloroform signal can be clearly distinguished as a single central peak. The flanking peaks are 13C satellite signals. Chemical identification of chloroform is unambiguous in this case.

Example 3

Effect of Flow Rate on Sample Convection

Figure 14B:
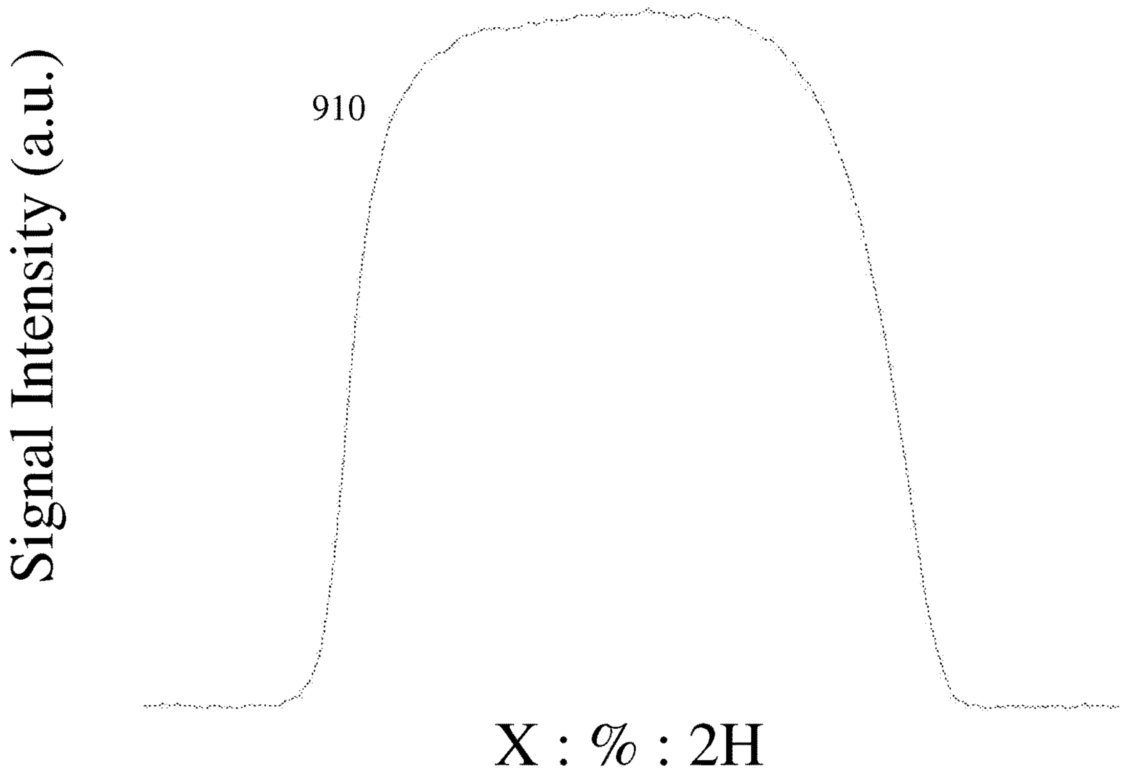
FIG. 14B shows a plot of NMR signal as a function of position of the sample (1% chloroform in acetone) where the gradient profile is measured with the RSVTC device 111 shown in FIG. 4B (increasing the VT flow rate from 970-920 did not eliminate sample convection), according to an embodiment of the invention.
Figure 14A:
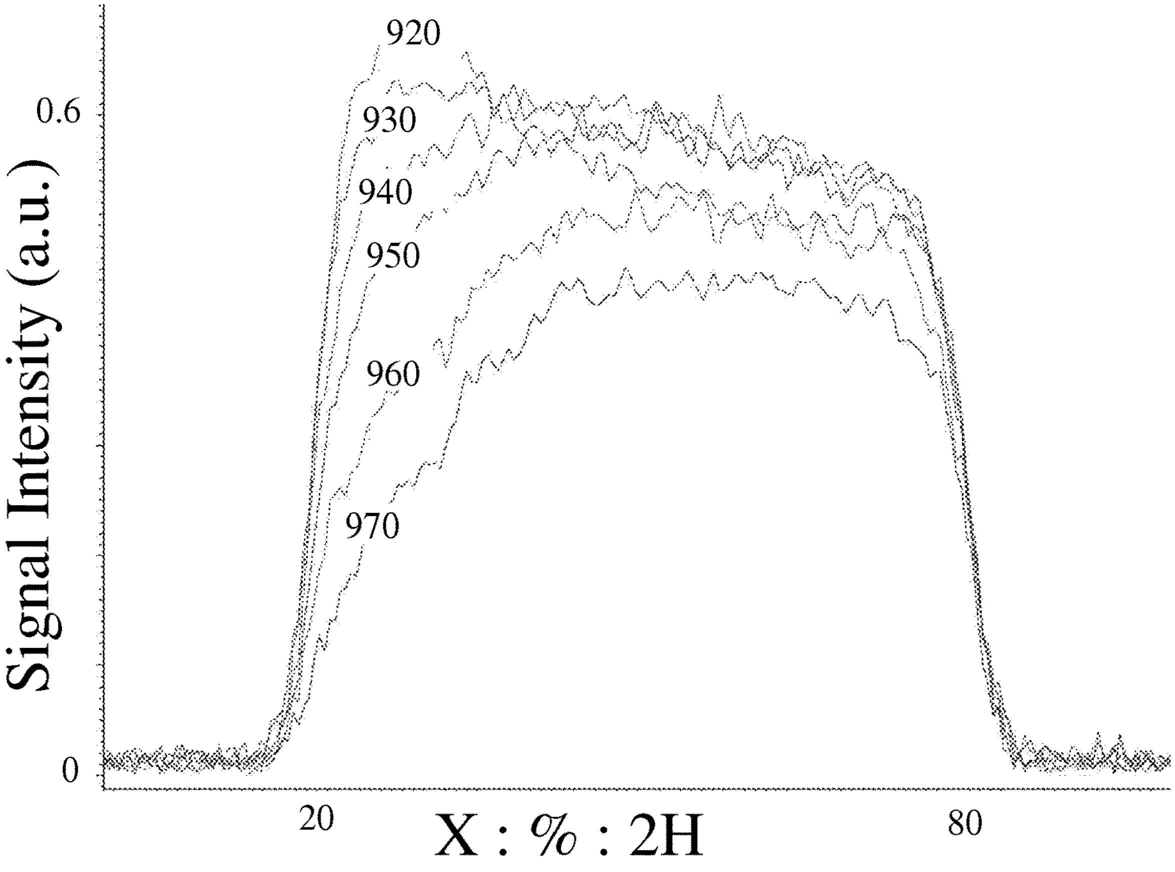
FIG. 14A shows a plot of NMR signal as a function of position of the sample (1% chloroform in acetone) where the gradient profile is measured with the device shown in FIG. 4A.

FIG. 14A shows a plot of NMR signal as a function of position of the sample (1% chloroform in acetone at room temperature (291-294° K)) where the gradient profile is measured with the device shown in FIG. 4A. The gradient profile is very uneven in the presence of sample convection. Also, increasing the VT flow rate from 970 see 920 did not eliminate sample convection.

FIG. 14B shows a plot of NMR signal as a function of position of the sample (1% chloroform in acetone at room temperature (291-294° K)) where the gradient profile is measured with the RSVTC device 111 shown in FIG. 4B (increasing the VT flow rate from 970-920 did not eliminate sample convection). In comparison, the gradient profile 910 in FIG. 14B is very even in the absence of sample convection.

Example 4

Reduced Change in Temperature Increases Resolution and Performance

FIG. 15A shows an NMR spectrum of a 0.25% NaOAc ($CH_3COONa$) sample in 99.96% $D_2O$ at room temperature (291-294° K) measured with the device shown in FIG. 4A. The $CH_3$ peak line width is 0.68 Hz, the $D_2O$ peak line width is 1.00 Hz. The change in line width is 0.32 and therefore the change in temperature is 0.0581° K with the device shown in FIG. 4A. In an embodiment of the present invention, FIG. 15B shows an NMR spectrum of a 0.25% NaOAc sample in 99.96% $D_2O$ at room temperature (291-294° K) measured with the RSVTC device 111 shown in FIG. 4B. In FIG. 15B the $CH_3$ peak is observed at 0.74298 Hz, the $D_2O$ peak is observed at 0.69634 Hz. The change in temperature is calculated (0.74298-0.69634/5.5) as 0.00848° K with the RSVTC device 111 shown in FIG. 4B. Unexpectedly, the RSVTC device 111 shown in FIG. 4B is able to better cool the sample than the device shown in FIG. 4A and thereby afford increased performance and resolution.

Example 5

Alternative Designs

Figure 3A:
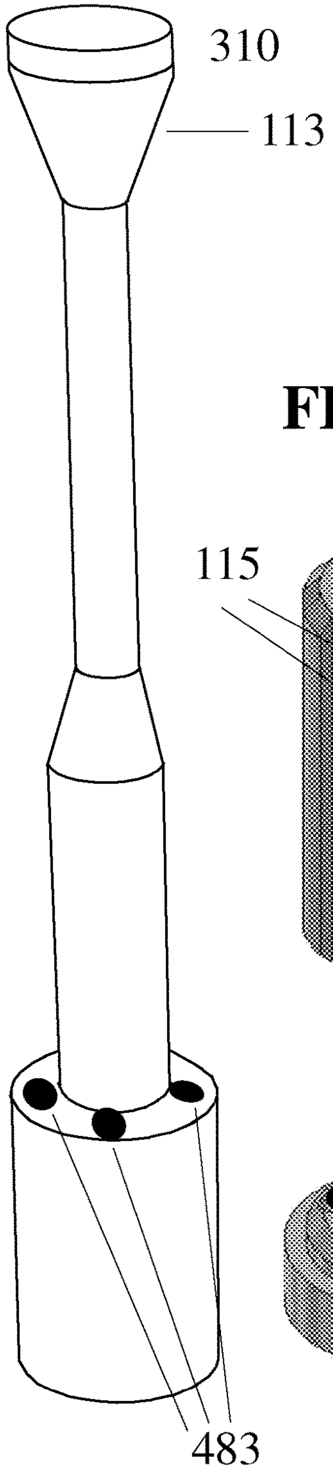
FIG. 3A is a schematic representation showing an alternative design for a dual RSVTC device 310 with a plurality of RSVTCs 483 and a flared section 113, according to an embodiment of the invention.

In an alternative embodiment of the present invention, FIG. 3A is a schematic representation showing a dual RSVTC device 310 with a flared section 113 to alter the velocity/pressure of fluid/gas which exits the RSVTC device 310 and enters the region 222. In another alternative embodiment of the present invention, FIG. 3B is a schematic representation showing an alternative design for a dual RSVTC device 320 with a plurality of the RSVTCs 484 and an area with a plurality of channels 115 to alter the velocity/pressure of fluid/gas which exits the RSVTC device 320 and enters the region 222.

Figure 3B:
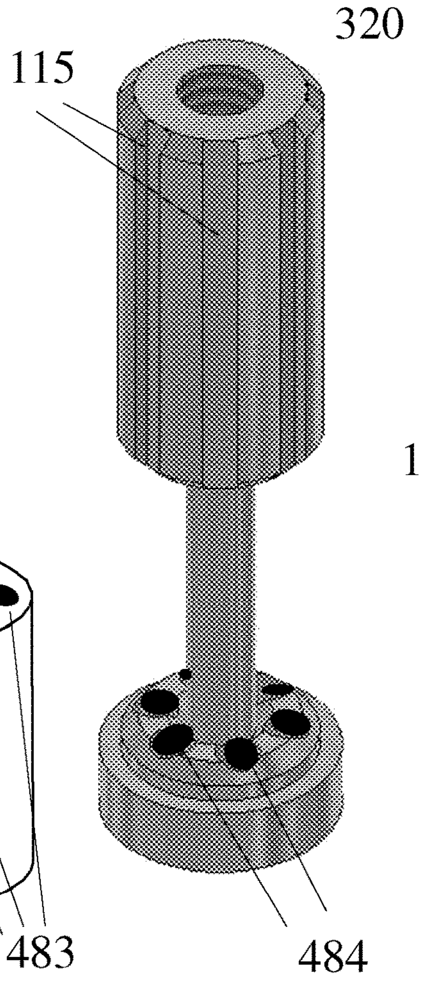
FIG. 3B is a schematic representation showing an alternative design for a dual RSVTC device 320 with a plurality of the RSVTCs 484 and a plurality of channels 115, according to an embodiment of the invention.
Figure 3C:
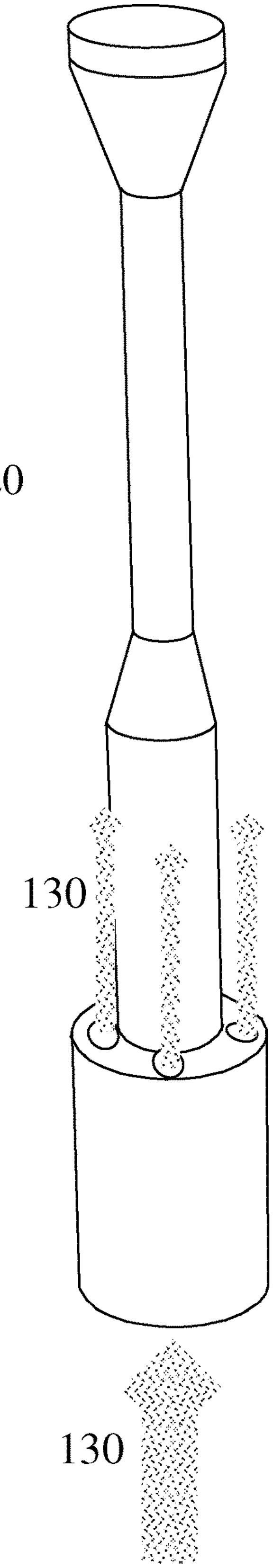
FIG. 3C is a schematic representation showing the fluid/gas flow 130 for an alternative design for a dual RSVTC device 310 to alter the velocity/pressure of fluid/gas which exits the RSVTC device 310, according to an embodiment of the invention.

FIG. 3C is a schematic representation of the dual RSVTC device 310 shown in FIG. 3A showing the fluid/gas flow 130 with a plurality of RSVTCs 483 and a flared section 113 to alter the velocity/pressure of fluid/gas which exits the RSVTC device 310 and which would enter the bore tube (not shown). FIG. 4C is a schematic diagram of a portion of a probe, where the sample cell 110 is in contact with a flow 130 of VT fluid/gas supplied from the chamber 120 and passes through the dual RSVTC device 310 exiting through the RSVTCs 483 and through the flared section 113 into the bore tube 238.

Figure 3D:
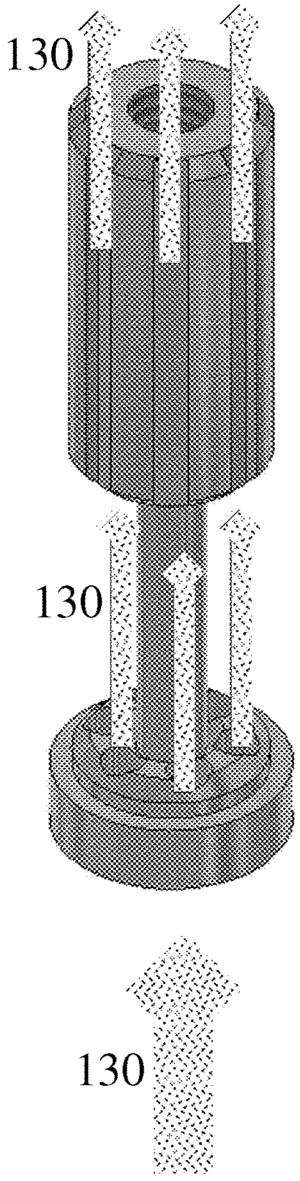
FIG. 3D is a schematic representation showing the fluid/gas flow 130 for an alternative design for a dual RSVTC device 320 to alter the velocity/pressure of fluid/gas which exits the RSVTC device 320, according to an embodiment of the invention.

FIG. 3D is a schematic representation of the dual RSVTC device 320 shown in FIG. 3B showing the fluid/gas flow 130 for an alternative design for a dual RSVTC device 320 with a plurality of RSVTCs 484 and an area with a plurality of channels 115 to alter the velocity/pressure of fluid/gas which exits the RSVTC device 320 and which would enter the bore tube (not shown). FIG. 4D is a schematic diagram of a portion of a probe, where the sample cell 110 is in contact with a flow 130 of VT fluid/gas supplied from the chamber 120 and passes through the dual RSVTC device 320 exiting through a plurality of the RSVTCs 484 into an area with channels 115 and into the bore tube 238.

In an alternative embodiment of the present invention, FIG. 4C is a schematic diagram of a portion of a probe, where the sample cell 110 is in contact with a flow 130 of variable temperature fluid gas supplied from the region 120 and passes through the RSVTCs 483 and through a flared section 113 into the bore tube area 222. In another alternative embodiment of the present invention, FIG. 4D is a schematic diagram of a portion of a probe, where the sample cell 110 is in contact with a flow 130 of variable temperature fluid gas supplied from the region 120 passes through a plurality of the RSVTCs 484 into an area with channels 115 and into the bore tube area 222. In an embodiment of the present invention, utilizing the alternative designs accelerates the variable temperature air before the air flow contacts the sample, the resulting NMR spectra show an increased performance, and/or line shape and/or resolution.

FURTHER EXAMPLES

Examples contemplated herein include Examples P1-P108 following.

Example P1

A NMRI adapted to detect a resonance of at least a nucleus from a plurality of nuclei of a sample molecule, including (i) a parent coil circuit including a parent coil and a sample coil circuit including a sample coil, (ii) a bore tube, (iii) a sample cell including a length adapted for holding the sample molecule, where the sample cell is adapted to be inserted into the bore tube, (iv) a gas supply adapted to provide a gas flow to the sample cell, and (v) a RSVTC including an entrance with a first diameter, a reduced section with a second diameter, and an exit with a third diameter, where the RSVTC is in fluid connection with the gas supply, where the RSVTC is in fluid connection with the bore tube, where the gas flow is adapted to pass through the RSVTC into the bore tube and contact the sample cell, where a plurality of gas molecules passing through the RSVTC are either cooled or warmed entering into the bore tube, where the NMRI is adapted to apply a magnetic field with the parent coil to the sample cell, where the NMRI is adapted to detect a NMRI mode of at least one of the plurality of nuclei of the sample molecule in the sample coil, where the gas supply contacting the sample cell cause the sample molecule to be either cooled or warmed.

Example P2

The NMRI of Example P1, where the third diameter is less than the first diameter.

Example P3

The NMRI of Example P1, where the second diameter is less than the first diameter.

Example P4

The NMRI of Example P1, where the RSVTC reduces turbulent flow of the plurality of gas molecules toward a laminar flow.

Example P5

The NMRI of Example P1, where the RSVTC reduces transition state flow of the plurality of gas molecules toward a laminar flow.

Example P6

The NMRI of Example P1, where the RSVTC changes the plurality of gas molecules entering the bore tube from a turbulent flow toward a transition state flow.

Example P7

The NMRI of Example P1, where the RSVTC changes the plurality of gas molecules entering the bore tube from a turbulent flow toward a laminar flow.

Example P8

The NMRI of Example P1, where the RSVTC changes the plurality of gas molecules entering the bore tube from a transition state flow toward a laminar flow.

Example P9

The NMRI of Example P1, where the plurality of gas molecules entering the bore tube are a transition state flow.

Example P10

The NMRI of Example P1, where the plurality of gas molecules entering the bore tube are a laminar flow.

Example P11

The NMRI of Example P1, where the plurality of gas molecules at the exit are between a lower limit of approximately 1600 Reynolds number, and an upper limit of approximately 2400 Reynolds number. In this circumstance, approximately means plus or minus twenty (20) percent.

Example P12

The NMRI of Example P1, where the plurality of gas molecules at the exit are between a lower limit of approximately 2000 Reynolds number, and an upper limit of approximately 2300 Reynolds number. In this circumstance, approximately means plus or minus twenty (20) percent.

Example P13

The NMRI of Example P1, where the RSVTC changes an average thermal gradient of sample molecules to between a lower limit of approximately 0.01° C., and an upper limit of approximately 0.05° C. In this circumstance, approximately means plus or minus twenty (20) percent.

Example P14

The NMRI of Example P1, where the RSVTC reduces a thermal gradient of sample molecules along the length of the sample cell to between a lower limit of approximately 0.01° C./mm, and an upper limit of approximately 0.05° C./mm. In this circumstance, approximately means plus or minus twenty (20) percent.

Example P15

The NMRI of Example P1, where the gas supply is adapted to supply a temperature regulated gas flow, where the temperature regulated gas flow is selected from the group consisting of temperature regulated air, temperature regulated nitrogen and temperature regulated helium.

Example P16

The NMRI of Example P1, where the second diameter is between a lower limit of approximately thirty (30) percent of the first diameter, and an upper limit of approximately ninety (90) percent of the first diameter. In this circumstance, approximately means plus or minus ten (10) percent.

Example P17

The NMRI of Example P1, where the second diameter is between a lower limit of approximately sixty (60) percent of the first diameter, and an upper limit of approximately eighty (80) percent of the first diameter. In this circumstance, approximately means plus or minus twenty (20) percent.

Example P18

A NMRI adapted to detect a resonance of at least a nucleus from a plurality of nuclei of a sample molecule, including (i) a parent coil circuit including a parent coil and a sample coil circuit including a sample coil, (ii) a bore tube including a first entrance and a second entrance with a first diameter, (iii) a cylindrical cell including a length with a second diameter adapted for holding the sample molecule, where the cylindrical cell is adapted to be inserted through the first entrance into the bore tube, (iv) a gas supply adapted to provide a temperature regulated gas flow, and (v) a dual RSVTC including a third entrance with a third diameter, a reduced section with a fourth diameter, and an exit with a fifth diameter, where the dual RSVTC is in fluid connection with the gas supply through the third entrance, where the dual RSVTC is in fluid connection with the second entrance of the bore tube through the exit, where the temperature regulated gas flow is adapted to pass through the dual RSVTC into the bore tube and contact the cylindrical cell, where the NMRI is adapted to apply a magnetic field with the parent coil to the cylindrical cell, where the NMRI is adapted to detect a NMR mode of at least one of the plurality of nuclei of the sample molecule in the sample coil, where the gas supply contacting the cylindrical cell cause the sample molecule to be either cooled or warmed, where a plurality of gas molecules passing through the dual RSVTC are either cooled or warmed, where the gas supply is emitted from the exit into the second entrance and contacts the cylindrical cell, where the sample molecule is either cooled or warmed by the gas supply.

Example P19

The NMRI of Example P18, where the fifth diameter is less than the third diameter.

Example P20

The NMRI of Example P18, where the fourth diameter is less than the third diameter.

Example P21

The NMRI of Example P18, where a turbulent flow of gas at the third entrance is reduced toward a transition state flow of gas at the exit.

Example P22

The NMRI of Example P18, where a turbulent flow of gas at the third entrance is reduced toward a laminar flow of gas at the exit.

Example P23

The NMRI of Example P18, where a transition state flow of gas at the third entrance is reduced toward a laminar flow of gas at the exit.

Example P24

The NMRI of Example P18, where the fourth diameter is between a lower limit of approximately thirty (30) percent of the first diameter, and an upper limit of approximately ninety (90) percent of the first diameter.

Example P25

The NMRI of Example P18, where the fourth diameter is between a lower limit of approximately sixty (60) percent of the first diameter, and an upper limit of approximately eighty (80) percent of the first diameter.

Example P26

The NMRI of Example P18, where the plurality of gas molecules at the exit are between a lower limit of approximately 1600 Reynolds number, and an upper limit of approximately 2400 Reynolds number.

Example P27

The NMRI of Example P18, where the plurality of gas molecules at the exit are between a lower limit of approximately 2000 Reynolds number, and an upper limit of approximately 2300 Reynolds number.

Example P28

The NMRI of Example P18, where the dual RSVTC reduces turbulent flow of the plurality of gas molecules toward a laminar flow.

Example P29

The NMRI of Example P18, where the dual RSVTC reduces turbulent flow of the plurality of gas molecules toward a transition state flow.

Example P30

The NMRI of Example P18, where the dual RSVTC reduces transition state flow of the plurality of gas molecules toward a laminar flow.

Example P31

The NMRI of Example P18, where the dual RSVTC changes the plurality of gas molecules entering the bore tube from a turbulent flow toward a transition state flow.

Example P32

The NMRI of Example P18, where the dual RSVTC changes the plurality of gas molecules entering the bore tube from a turbulent flow toward a laminar flow.

Example P33

The NMRI of Example P18, where the dual RSVTC changes the plurality of gas molecules entering the bore tube from a transition state flow toward a laminar flow.

Example P34

The NMRI of Example P18, where the plurality of gas molecules entering the bore tube are a transition state flow.

Example P35

The NMRI of Example P18, where the plurality of gas molecules entering the bore tube are a laminar flow.

Example P36

The NMRI of Example P18, where the dual RSVTC changes an average thermal gradient of sample molecules to between a lower limit of approximately 0.01° C., and an upper limit of approximately 0.05° C.

Example P37

The NMRI of Example P18, where the dual RSVTC reduces a thermal gradient of sample molecules along the length of the cylindrical cell to between a lower limit of approximately 0.01° C./mm, and an upper limit of approximately 0.05° C./mm.

Example P38

The NMRI of Example P18, where the temperature regulated gas flow is selected from the group consisting of temperature regulated air, temperature regulated nitrogen and temperature regulated helium.

Example P39

A NMRI adapted to detect a resonance of at least a nucleus from a plurality of nuclei of a sample molecule, including (i) a parent coil circuit including a parent coil and a sample coil circuit including a sample coil, (ii) a bore tube, (iii) a cell including a length, the cell adapted for holding the sample molecule, where the cell is adapted to be inserted into the bore tube, (iv) a gas supply adapted to provide a temperature regulated gas flow, and (v) a RSVTC including an entrance with a first diameter, a reduced section with a second diameter, and an exit with a third diameter, where the RSVTC is in fluid connection with the gas supply, where the RSVTC is in fluid connection with the bore tube, where the NMRI is adapted to apply a magnetic field with the parent coil to the cell, where the NMRI is adapted to detect a NMR mode of at least one of the plurality of nuclei of the sample molecule in the sample coil, where the temperature regulated gas flow passes through the RSVTC, where a plurality of gas molecules with an average velocity passing through the RSVTC cause an increase in the average velocity before passing into the bore tube and contacting the cell, where the plurality of gas molecules contacting the cell cause the sample molecule to be either cooled or warmed.

Example P40

The NMRI of Example P39, where the third diameter is less than the first diameter.

Example P41

The NMRI of Example P39, where the second diameter is less than the first diameter.

Example P42

The NMRI of Example P39, where a turbulent flow of gas at the entrance is reduced toward a transition state flow of gas at the exit.

Example P43

The NMRI of Example P39, where a turbulent flow of gas at the entrance is reduced toward a laminar flow of gas at the exit.

Example P44

The NMRI of Example P39, where a transition state flow of gas at the entrance is reduced toward a laminar flow of gas at the exit.

Example P45

The NMRI of Example P39, where the second diameter is between a lower limit of approximately thirty (30) percent of the first diameter and an upper limit of approximately ninety (90) percent of the first diameter.

Example P46

The NMRI of Example P39, where the second diameter is between a lower limit of approximately sixty (60) percent of the first diameter and an upper limit of approximately eighty (80) percent of the first diameter.

Example P47

The NMRI of Example P39, where the plurality of gas molecules at the exit are between a lower limit of approximately 1600 Reynolds number and an upper limit of approximately 2400 Reynolds number.

Example P48

The NMRI of Example P39, where the plurality of gas molecules at the exit are between a lower limit of approximately 2000 Reynolds number, and an upper limit of approximately 2300 Reynolds number.

Example P49

The NMRI of Example P39, where the RSVTC reduces turbulent flow of the plurality of gas molecules toward a laminar flow.

Example P50

The NMRI of Example P39, where the RSVTC reduces turbulent flow of the plurality of gas molecules toward a transition state flow.

Example P51

The NMRI of Example P39, where the RSVTC reduces transition state flow of the plurality of gas molecules toward a laminar flow.

Example P52

The NMRI of Example P39, where the RSVTC changes the plurality of gas molecules entering the bore tube from a turbulent flow toward a transition state flow.

Example P53

The NMRI of Example P39, where the RSVTC changes the plurality of gas molecules entering the bore tube from a turbulent flow toward a laminar flow.

Example P54

The NMRI of Example P39, where the RSVTC changes the plurality of gas molecules entering the bore tube from a transition state flow toward a laminar flow.

Example P55

The NMRI of Example P39, where the plurality of gas molecules entering the bore tube are a transition state flow.

Example P56

The NMRI of Example P39, where the plurality of gas molecules entering the bore tube are a laminar flow.

Example P57

The NMRI of Example P39, where the RSVTC changes an average thermal gradient of sample molecules to between a lower limit of approximately 0.01° C., and an upper limit of approximately 0.05° C.

Example P58

The NMRI of Example P39, where the RSVTC reduces a thermal gradient of sample molecules along the length of the cell to between a lower limit of approximately 0.01° C./mm, and an upper limit of approximately 0.05° C./mm.

Example P59

The NMRI of Example P39, where the gas supply is adapted to supply the temperature regulated gas flow, where the temperature regulated gas flow is selected from the group consisting of temperature regulated air, temperature regulated nitrogen and temperature regulated helium.

Example P60

A RSVTC including an entrance with a first diameter, a reduced section with a second diameter, and an exit with a third diameter, where the RSVTC is adapted to connect with a gas flow including a plurality of gas molecules, where the RSVTC is adapted to connect to a bore tube such that passage of the plurality of gas molecules through the RSVTC deliver the plurality of gas molecules in the bore tube and contact a sample cell of a length of a NMR instrument, where the plurality of gas molecules passing through the RSVTC to be either cooled or warmed entering into the bore tube, where the plurality of gas molecules contacting the sample cell cause at least a plurality of sample molecules in the sample cell to be either cooled or warmed.

Example P61

The RSVTC of Example P60, where the third diameter is less than the first diameter.

Example P62

The RSVTC of Example P60, where the second diameter is less than the first diameter.

Example P63

The RSVTC of Example P60, where the RSVTC reduces turbulent flow of the plurality of gas molecules toward a laminar flow.

Example P64

The RSVTC of Example P60, where the RSVTC reduces transition state flow of the plurality of gas molecules toward a laminar flow.

Example P65

The RSVTC of Example P60, where the RSVTC changes the plurality of gas molecules entering the bore tube from a turbulent flow toward a transition state flow.

Example P66

The RSVTC of Example P60, where the RSVTC changes the plurality of gas molecules entering the bore tube from a turbulent flow toward a laminar flow.

Example P67

The RSVTC of Example P60, where the RSVTC changes the plurality of gas molecules entering the bore tube from a transition state flow toward a laminar flow.

Example P68

The RSVTC of Example P60, where the plurality of gas molecules entering the bore tube are a transition state flow.

Example P69

The RSVTC of Example P60, where the plurality of gas molecules entering the bore tube are a laminar flow.

Example P70

The RSVTC of Example P60, where the plurality of gas molecules at the exit are between a lower limit of approximately 1600 Reynolds number, and an upper limit of approximately 2400 Reynolds number.

Example P71

The RSVTC of Example P60, where the plurality of gas molecules at the exit are between a lower limit of approximately 2000 Reynolds number, and an upper limit of approximately 2300 Reynolds number.

Example P72

The RSVTC of Example P60, where the RSVTC changes an average thermal gradient of sample molecules to between a lower limit of approximately 0.01° C., and an upper limit of approximately 0.05° C.

Example P73

The RSVTC of Example P60, where the RSVTC reduces a thermal gradient of sample molecules along the length of the sample cell to between a lower limit of approximately 0.01° C./mm, and an upper limit of approximately 0.05° C./mm.

Example P74

The RSVTC of Example P60, where the gas flow including the plurality of gas molecules is adapted to supply a temperature regulated gas flow, where the temperature regulated gas flow is selected from the group consisting of temperature regulated air, temperature regulated nitrogen and temperature regulated helium.

Example P75

The RSVTC of Example P60, where the second diameter is between a lower limit of approximately thirty (30) percent of the first diameter, and an upper limit of approximately ninety (90) percent of the first diameter.

Example P76

The RSVTC of Example P60, where the second diameter is between a lower limit of approximately sixty (60) percent of the first diameter, and an upper limit of approximately eighty (80) percent of the first diameter.

Example P77

A dual RSVTC including an entrance with a first diameter, a reduced section with a second diameter, a plurality of channels, and a plurality of exits, where the dual RSVTC is adapted to connect with a gas flow including a plurality of gas molecules, where the dual RSVTC is adapted to connect to a bore tube such that passage of the plurality of gas molecules through the dual RSVTC deliver the plurality of gas molecules in the bore tube and contact a sample cell of a length of a NMR instrument, where the plurality of gas molecules passing through the dual RSVTC are either cooled or warmed entering into the bore tube, where the plurality of gas molecules contacting the sample cell cause at least a plurality of sample molecules in the sample cell to be either cooled or warmed.

Example P78

The dual RSVTC of Example P77, where the second diameter is less than the first diameter.

Example P79

The dual RSVTC of Example P77, where the dual RSVTC reduces turbulent flow of the plurality of gas molecules toward a laminar flow.

Example P80

The dual RSVTC of Example P77, where the dual RSVTC reduces transition state flow of the plurality of gas molecules toward a laminar flow.

Example P81

The dual RSVTC of Example P77, where the dual RSVTC changes the plurality of gas molecules entering the bore tube from a turbulent flow toward a transition state flow.

Example P82

The dual RSVTC of Example P77, where the dual RSVTC changes the plurality of gas molecules entering the bore tube from a turbulent flow toward a laminar flow.

Example P83

The dual RSVTC of Example P77, where the dual RSVTC changes the plurality of gas molecules entering the bore tube from a transition state flow toward a laminar flow.

Example P84

The dual RSVTC of Example P77, where the plurality of gas molecules entering the bore tube are a transition state flow.

Example P85

The dual RSVTC of Example P77, where the plurality of gas molecules entering the bore tube are a laminar flow.

Example P86

The dual RSVTC of Example P77, where the plurality of gas molecules at an exit of the plurality of exits are between a lower limit of approximately 1600 Reynolds number, and an upper limit of approximately 2400 Reynolds number.

Example P87

The dual RSVTC of Example P77, where the plurality of gas molecules at an exit of the plurality of exits are between a lower limit of approximately 2000 Reynolds number, and an upper limit of approximately 2300 Reynolds number.

Example P88

The dual RSVTC of Example P77, where the dual RSVTC changes an average thermal gradient of sample molecules to between a lower limit of approximately 0.01° C., and an upper limit of approximately 0.05° C.

Example P89

The dual RSVTC of Example P77, where the dual RSVTC reduces a thermal gradient of sample molecules along the length of the sample cell to between a lower limit of approximately 0.01° C./mm, and an upper limit of approximately 0.05° C./mm.

Example P90

The dual RSVTC of Example P77, where the second diameter is between a lower limit of approximately thirty (30) percent of the first diameter, and an upper limit of approximately ninety (90) percent of the first diameter.

Example P91

The dual RSVTC of Example P77, where the second diameter is between a lower limit of approximately sixty (60) percent of the first diameter, and an upper limit of approximately eighty (80) percent of the first diameter.

Example P92

A kit for improving one or both resolution and performance in a NMRI including A RSVTC adapted to connect to a gas supply, the RSVTC adapted to connect to a bore tube of the NMRI, a first instruction for connecting the RSVTC to the gas supply, and a second instruction for connecting the RSVTC to the bore tube.

Example P93

A kit for improving one or both resolution and performance in a NMRI including a dual RSVTC adapted to connect to a gas supply, the dual RSVTC adapted to connect to a bore tube of the NMRI, a first instruction for connecting the dual RSVTC to the gas supply, and a second instruction for connecting the dual RSVTC to the bore tube.

Example P94

A method of detecting a NMR resonance of at least a nucleus from a plurality of nuclei of a sample molecule using a gas flow through a RSVTC to either cool or heat the sample molecule, including (i) selecting a parent coil circuit including a parent coil and a sample coil circuit including a sample coil, (ii) selecting a sample, (iii) loading a plurality of sample molecules into a sample cell, where the sample cell comprises a length, (iv) introducing the sample cell into a bore tube, (v) passing a flow of a gas through the RSVTC into contact with the sample cell, (vi) applying a magnetic field with the parent coil to the sample cell, and (vii) exciting with the sample coil the plurality of sample molecules with one or both a radio frequency field and a microwave frequency field at a Larmor frequency to allow the parent coil to detect the resonance of the nucleus.

Example P95

The method of Example P94, further including spinning the sample cell.

Example P96

The method of Example P94, where the RSVTC changes an average thermal gradient of the plurality of sample molecules to between a lower limit of approximately 0.01° C., and an upper limit of approximately 0.05° C.

Example P97

The method of Example P94, where the RSVTC reduces a thermal gradient of the plurality of sample molecules along the length of the sample cell to between a lower limit of approximately 0.01° C./mm, and an upper limit of approximately 0.05° C./mm.

Example P98

The method of Example P94, where the gas is selected from the group consisting of temperature regulated air, temperature regulated nitrogen and temperature regulated helium.

Example P99

A method of detecting a NMR resonance of at least a nucleus from a plurality of nuclei of a sample molecule using a gas flow through a dual RSVTC to either cool or heat the sample molecule, including (i) selecting a parent coil circuit including a parent coil and a sample coil circuit including a sample coil, (ii) selecting a sample, (iii) loading a plurality of sample molecules into a sample cell, where the sample cell comprises a length, (iv) introducing the sample cell into a bore tube, (v) passing a flow of a gas through the dual RSVTC into contact with the sample cell, (vi) applying a magnetic field with the parent coil to the sample cell, and (vii) exciting with the sample coil the plurality of sample molecules with one or both a radio frequency field and a microwave frequency field at a Larmor frequency to allow the parent coil to detect the resonance of the nucleus.

Example P100

The method of Example P99, further including spinning the sample cell.

Example P101

The method of Example P99, where the dual RSVTC changes an average thermal gradient of the plurality of sample molecules to between a lower limit of approximately 0.01° C., and an upper limit of approximately 0.05° C.

Example P102

The method of Example P99, where the dual RSVTC reduces a thermal gradient of the plurality of sample molecules along the length of the sample cell to between a lower limit of approximately 0.01° C./mm, and an upper limit of approximately 0.05° C./mm.

Example P103

The method of Example P99, where the gas is selected from the group consisting of temperature regulated air, temperature regulated nitrogen and temperature regulated helium.

Example P104

A NMR instrument adapted to detect a resonance of at least a nucleus from a plurality of nuclei of a sample molecule, including a parent coil circuit including a parent coil and a sample coil circuit including a sample coil, a bore tube, a sample cell including a length adapted for holding the sample molecule, where the sample cell is adapted to be inserted into the bore tube, a gas supply adapted to provide a gas flow to the sample cell, where the gas flow is adapted to spin the sample cell, a VT chamber including an entrance with a first diameter, a reduced section with a second diameter, and an exit with a third diameter, where the VT chamber is in fluid connection with the gas supply and the bore tube, where the gas flow is adapted to pass into the bore tube, where a plurality of gas molecules passing through the reduced section are either cooled or warmed before passing into the bore tube and contacting the sample cell, where the NMR instrument is adapted to apply a magnetic field with the parent coil to the sample cell, where the NMR instrument is adapted to detect a NMR mode of at least one of the plurality of nuclei of the sample molecule in the sample coil, where the gas supply contacting the sample cell cause the sample molecule to be either cooled or warmed.

Example P105

The NMR instrument of Example P104, where the third diameter is less than the first diameter.

Example P106

A NMRI adapted to detect a resonance of at least a nucleus from a plurality of nuclei of a sample molecule, including (i) a parent coil circuit including a parent coil and a sample coil circuit including a sample coil, (ii) a bore tube, (iii) a sample cell including a length adapted for holding the sample molecule, where the sample cell is adapted to be inserted into the bore tube, (iv) a gas supply adapted to provide a gas flow to the sample cell, and (v) a RSVTC including an entrance with a first diameter, a reduced section with a second diameter, and an exit with a third diameter, where the RSVTC is in fluid connection with the gas supply, where the RSVTC is in fluid connection with the bore tube, where the gas flow is adapted to pass through the RSVTC into the bore tube and contact the sample cell, where a plurality of gas molecules passing through the RSVTC are either cooled or warmed entering into the bore tube, where the NMRI is adapted to apply a magnetic field with the parent coil to the sample cell, where the NMRI is adapted to detect a NMRI mode of at least one of the plurality of nuclei of the sample molecule in the sample coil, where the gas supply contacting the sample cell cause the sample molecule to be either cooled or warmed, where the plurality of gas molecules passing through the RSVTC are cooled when thermal radiation is heating the sample molecules and the plurality of gas molecules passing through the RSVTC are heated when thermal radiation is cooling the sample molecules.

Example P107

A method of detecting a NMR resonance of at least a nucleus from a plurality of nuclei of a sample molecule using a gas flow through a dual RSVTC to either cool or heat the sample molecule, including (i) selecting a parent coil circuit including a parent coil and a sample coil circuit including a sample coil, (ii) selecting a sample, (iii) loading a plurality of sample molecules into a sample cell, where the sample cell comprises a length, (iv) introducing the sample cell into a bore tube, (v) passing a flow of a gas through the dual RSVTC into contact with the sample cell, (vi) applying a magnetic field with the parent coil to the sample cell, and (vii) exciting with the sample coil the plurality of sample molecules with one or both a radio frequency field and a microwave frequency field at a Larmor frequency to allow the parent coil to detect the resonance of the nucleus, where the plurality of gas molecules passing through the RSVTC are cooled when thermal radiation is heating the sample molecules and the plurality of gas molecules passing through the RSVTC are heated when thermal radiation is cooling the sample molecules.

Example P108

A method of detecting a NMR resonance of at least a nucleus from a plurality of nuclei of a sample molecule using a gas flow through a RSVTC to either cool or heat the sample molecule, including (i) selecting a parent coil circuit including a parent coil and a sample coil circuit including a sample coil, (ii) selecting a sample, (iii) loading a plurality of sample molecules into a sample cell, where the sample cell comprises a length, (iv) introducing the sample cell into a bore tube, (v) passing a flow of a gas through the RSVTC into contact with the sample cell, (vi) applying a magnetic field with the parent coil to the sample cell, and (vii) exciting with the sample coil the plurality of sample molecules with one or both a radio frequency field and a microwave frequency field at a Larmor frequency to allow the parent coil to detect the resonance of the nucleus, where the plurality of gas molecules passing through the RSVTC are cooled when thermal radiation is heating the sample molecules and the plurality of gas molecules passing through the RSVTC are heated when thermal radiation is cooling the sample molecules.

Example P109

The method of Example P107, further comprising where the flow of a gas through the RSVTC into contact with the sample cell cools the sample molecules when thermal radiation is heating the sample molecules, where the flow of a gas through the RSVTC into contact with the sample cell heats the sample molecules when thermal radiation is cooling the sample molecules.

Abbreviations: Deuterated water=$D_2O$; Magnetic Field=$B_1$; Nuclear Magnetic Resonance=NMR; Nuclear Magnetic Resonance Instrument=NMRI; Radio Frequency=RF; Reduced Section Variable Temperature Chamber=RSVTC; Signal to Noise Ratio=SNR; Sodium acetate=NaAc; Static Magnetic Field=$B_0$; Variable Temperature=VT.

While the systems, methods, and devices have been illustrated by the described examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and devices provided herein. Additional advantages and modifications will readily be apparent to those skilled in the art. Therefore, the invention, in its broader aspects, is not limited to the specific details, the representative system, method or device, and illustrative examples shown and described. Accordingly, departures may be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

What is claimed is:

1. A NMRI (Nuclear Magnetic Resonance Instrument) adapted to detect a resonance of at least a nucleus from a plurality of nuclei of a sample molecule, comprising:

(i) a parent coil circuit comprising a parent coil and a sample coil circuit comprising a sample coil, where the parent coil comprises one or both a radio frequency coil and a microwave frequency coil;

(ii) a bore tube;

(iii) a sample cell comprising a length adapted for holding the sample molecule, where the sample cell is adapted to be inserted into the bore tube;

(iv) a gas supply adapted to provide a gas flow to the sample cell; and (v) a RSVTC (Restricted Section Variable Temperature Chamber) comprising an entrance with a first diameter, a reduced section with a second diameter, and an exit with a third diameter, where the RSVTC is in fluid connection with the gas supply, where the RSVTC is in fluid connection with the bore tube, where the gas flow is adapted to pass through the RSVTC into the bore tube and contact the sample cell, where a plurality of gas molecules passing through the RSVTC are either heated/cooled entering into the bore tube, where the NMRI is adapted to apply a magnetic field with the parent coil to the sample cell, where the NMRI is adapted to detect a NMRI mode of at least one of the plurality of nuclei of the sample molecule in the sample coil, where the gas supply contacting the sample cell cause the sample molecule to be heated/cooled.

2. The NMRI of claim 1, where the third diameter is less than the first diameter.

3. The NMRI of claim 1, where the second diameter is less than the first diameter.

4. The NMRI of claim 1, where the RSVTC reduces turbulent flow of the plurality of gas molecules toward a laminar flow.

5. The NMRI of claim 1, where the RSVTC reduces transition state flow of the plurality of gas molecules toward a laminar flow.

6. The NMRI of claim 1, where the RSVTC changes the plurality of gas molecules entering the bore tube from a turbulent flow toward a transition state flow.

7. The NMRI of claim 1, where the RSVTC changes the plurality of gas molecules entering the bore tube from a turbulent flow toward a laminar flow.

8. The NMRI of claim 1, where the RSVTC changes the plurality of gas molecules entering the bore tube from a transition state flow toward a laminar flow.

9. The NMRI of claim 1, where the plurality of gas molecules entering the bore tube are a transition state flow.

10. The NMRI of claim 1, where the plurality of gas molecules entering the bore tube are a laminar flow.

11. The NMRI of claim 1, where the plurality of gas molecules at the exit are between:

a lower limit of approximately 1600 Reynolds number; and an upper limit of approximately 2400 Reynolds number.

12. The NMRI of claim 1, where the plurality of gas molecules at the exit are between:

a lower limit of approximately 2000 Reynolds number; and an upper limit of approximately 2300 Reynolds number.

13. The NMRI of claim 1, where the RSVTC changes an average thermal gradient of sample molecules to between:

a lower limit of approximately 0.01° C.; and an upper limit of approximately 0.05° C.

14. The NMRI of claim 1, where the RSVTC reduces a thermal gradient of sample molecules along the length of the sample cell to between:

a lower limit of approximately 0.01° C./mm; and an upper limit of approximately 0.05° C./mm.

15. The NMRI of claim 1, where the second diameter is between:

a lower limit of approximately thirty (30) percent of the first diameter; and an upper limit of approximately ninety (90) percent of the first diameter.

16. The NMRI of claim 1, where the second diameter is between:

a lower limit of approximately sixty (60) percent of the first diameter; and an upper limit of approximately eighty (80) percent of the first diameter.

17. The NMRI of claim 1, where the plurality of gas molecules passing through the RSVTC are cooled when thermal radiation is heating the sample molecules and the plurality of gas molecules passing through the RSVTC are heated when thermal radiation is cooling the sample molecules.

18. The dual RSVTC (Restricted Section Variable Temperature Chamber) comprising:

an entrance with a first diameter;

a reduced section with a second diameter;

a plurality of channels; and a plurality of exits, where the dual RSVTC is adapted to connect with a gas flow comprising a plurality of gas molecules, where the dual RSVTC is adapted to connect to a bore tube such that passage of the plurality of gas molecules through the dual RSVTC deliver the plurality of gas molecules in the bore tube and contact a sample cell of a length of a NMR (Nuclear Magnetic Resonance) instrument, where the plurality of gas molecules passing through the dual RSVTC are either heated or cooled entering into the bore tube, where the plurality of gas molecules contacting the sample cell cause at least a plurality of sample molecules in the sample cell to be heated/cooled.

19. A method of detecting a NMR (Nuclear Magnetic Resonance) resonance of at least a nucleus from a plurality of nuclei of a sample molecule using a gas flow through a RSVTC (Restricted Section Variable Temperature Chamber) to heat/cool the sample molecule, where the RSVTC comprises an entrance with a first diameter, a reduced section with a second diameter, and an exit with a third diameter, comprising:

(i) selecting a parent coil circuit comprising a parent coil and a sample coil circuit comprising a sample coil;

(ii) selecting a sample;

(iii) loading a plurality of sample molecules into a sample cell, where the sample cell comprises a length;

(iv) introducing the sample cell into a bore tube;

(v) applying a magnetic field with the parent coil to the sample cell;

(vi) exciting with the sample coil the plurality of sample molecules with one or both a radio frequency field and a microwave frequency field at a Larmor frequency to allow the parent coil to detect the resonance of the nucleus; and (vii) passing a flow of a gas through the RSVTC into contact with the sample cell to heat/cool the sample molecules.

20. The method of claim 19, where the flow of a gas through the RSVTC into contact with the sample cell cools the sample molecules when thermal radiation is heating the sample molecules, where the flow of a gas through the RSVTC into contact with the sample cell heats the sample molecules when thermal radiation is cooling the sample molecules.

* * * * *